(12) United States Patent
Haruki et al.

(10) Patent No.: US 10,787,135 B2
(45) Date of Patent: Sep. 29, 2020

(54) SWITCHING CIRCUIT, FAILURE DETECTION METHOD THEREFOR, AND CONTROL APPARATUS

(71) Applicant: Mazda Motor Corporation, Aki-gun, Hiroshima (JP)

(72) Inventors: Jun Haruki, Hiroshima (JP); Shigeyuki Uehara, Hiroshima (JP); Taiki Kado, Hiroshima (JP)

(73) Assignee: Mazda Motor Corporation, Aki-gun, Hiroshima (JP)

( * ) Notice: Subject to any disclaimer, the term of this patent is extended or adjusted under 35 U.S.C. 154(b) by 4 days.

(21) Appl. No.: 16/348,789

(22) PCT Filed: Oct. 25, 2017

(86) PCT No.: PCT/JP2017/038515
§ 371 (c)(1),
(2) Date: May 9, 2019

(87) PCT Pub. No.: WO2018/092532
PCT Pub. Date: May 24, 2018

(65) Prior Publication Data
US 2019/0263335 A1 Aug. 29, 2019

(30) Foreign Application Priority Data

Nov. 15, 2016 (JP) ................................. 2016-222206

(51) Int. Cl.
*B60R 16/023* (2006.01)
*B60T 7/08* (2006.01)
(Continued)

(52) U.S. Cl.
CPC .......... *B60R 16/023* (2013.01); *B60R 16/005* (2013.01); *B60R 16/02* (2013.01); *B60T 7/08* (2013.01); *B60T 7/085* (2013.01); *B60T 17/22* (2013.01); *H01H 9/54* (2013.01); *H03K 17/00* (2013.01)

(58) Field of Classification Search
CPC . B60T 7/08; B60T 17/22; B60T 7/085; B60R 16/023; B60R 16/02; B60R 16/005; H03K 17/00; H01H 9/54
See application file for complete search history.

(56) References Cited

U.S. PATENT DOCUMENTS

| 8,432,060 B2 | 4/2013 | Grieser-Schmitz et al. |
| 10,399,553 B2 * | 9/2019 | Kawai .................. B60T 17/223 |

(Continued)

FOREIGN PATENT DOCUMENTS

| DE | 102013009025 A1 | 12/2013 |
| JP | 2015106463 A | 6/2015 |

(Continued)

*Primary Examiner* — Daniel Kessie
(74) *Attorney, Agent, or Firm* — Alleman Hall Creasman & Tuttle LLP

(57) ABSTRACT

A switching circuit includes: an input/output terminal section including four SW terminals; lines connecting between these terminals; switches disposed in paths of the respective lines; and diodes disposed in the paths of the respective lines. The switches are single-pole switches. The diodes are connected to normally closed terminals of the switches, respectively.

14 Claims, 24 Drawing Sheets

(51) Int. Cl.
*B60T 17/22* (2006.01)
*B60R 16/02* (2006.01)
*H03K 17/00* (2006.01)
*B60R 16/00* (2006.01)
*H01H 9/54* (2006.01)

(56) References Cited

U.S. PATENT DOCUMENTS

| | | | |
|---|---|---|---|
| 2002/0040842 A1* | 4/2002 | Arndt | B60T 7/107 |
| | | | 200/61.12 |
| 2007/0007819 A1* | 1/2007 | Shoemaker | H01H 1/62 |
| | | | 307/9.1 |
| 2008/0262687 A1* | 10/2008 | Fujita | B60T 7/12 |
| | | | 701/70 |
| 2010/0314225 A1* | 12/2010 | Grieser-Schmitz | |
| | | | H01H 47/002 |
| | | | 200/17 R |
| 2013/0241563 A1* | 9/2013 | Heise | G01R 31/327 |
| | | | 324/415 |
| 2013/0314222 A1 | 11/2013 | Park | |
| 2019/0368163 A1* | 12/2019 | Lim | E02F 9/22 |

FOREIGN PATENT DOCUMENTS

| | | |
|---|---|---|
| KR | 20110072015 A | 6/2011 |
| WO | 2009118239 A2 | 10/2009 |

* cited by examiner

NEUTRAL STATE

ACTUATION RELEASED STATE 10,787,135 B2

SWITCHING CIRCUIT, FAILURE DETECTION METHOD THEREFOR, AND CONTROL APPARATUS

TECHNICAL FIELD

The present invention relates to a switching circuit for operating an electric parking brake (EPB), and a failure detection method therefor, and a control apparatus to which the switching circuit is connected.

BACKGROUND ART

A switching circuit has been used to operate an EPB of a vehicle (see Patent Documents 1 and 2, for example). Each of the known switching circuits disclosed in the Documents includes four input/output terminals, and switches and diodes connected between the terminals. By selectively turning on and off the respective switches, an actuation state of the EPB is controlled and a failure of the switching circuit is detected.

CITATION LIST

Patent Document

PATENT DOCUMENT 1: U.S. Pat. No. 8,432,060
PATENT DOCUMENT 2: Japanese Unexamined Patent Publication No. 2015-106463

SUMMARY OF THE INVENTION

Technical Problem

However, the known switching circuit disclosed in Patent Document 1 has many contacts, and accordingly many failure modes need to be detected. The known switching circuit disclosed in Patent Document 2 may require a smaller number of diodes than the switching circuit disclosed in Patent Document 1. However, not all the expected failure modes can be detected. Besides, a failure of a switch for changing external power supplies needs to be detected separately. Furthermore, the operational state of the EPB may not be recognized correctly when a failure cannot be detected.

It is therefore an object of the present invention to provide a switching circuit which has a small number of failure modes and which enables correct recognition of the operational state of an EPB even when a failure occurs in the switching circuit.

Solution to the Problem

To achieve the above object, a switching circuit according to the present invention is directed to a switching circuit configured to control actuation of an electric parking brake of a vehicle. The switching circuit includes at least: an input/output terminal section including first to fourth terminals; a first line electrically connecting between the first terminal and the fourth terminal; a second line branching off from the first line and electrically connecting between the fourth terminal and the second terminal; a third line electrically connecting the first terminal and the third terminal; a fourth line branching off from the third line and electrically connecting between the third terminal and the second terminal; a first switch and a first diode that are disposed in a path of the first line; a second switch and a second diode that are disposed in a path of the second line; a third switch and a third diode that are disposed in a path of the third line; and a fourth switch and a fourth diode that are disposed in a path of the fourth line. All of the four first to fourth switches are single-pole switches, or three of the first to fourth switches are single-pole switches and one of the first to fourth switches is a three-way switch. The first diode is provided to a normally closed terminal of the first switch. The second diode is provided to a normally closed terminal of the second switch. The third diode is provided to a normally closed terminal of the third switch. The fourth diode is provided to a normally closed terminal of the fourth switch.

With this configuration, the electric parking brake can be operated with a simple configuration in which, with respect to the four terminals of the switching circuit, the same number of lines, switches, and diodes are disposed in the paths of the respective lines. Furthermore, a smaller number of components is required, which makes it possible to reduce the number of failure modes that need to be detected, and hence to reduce time for failure detection and analysis.

Preferably, the first to fourth diodes are disposed such that all of the four diodes are oriented in the same direction.

With this configuration, directions in which currents flow between the terminals are restricted, and thus the open/closed state of each switch is less likely to be misrecognized. Furthermore, a failure can be detected easily.

Preferably, the first switch and the fourth switch constitute one switch group, and the second switch and the third switch constitute another switch group. Preferably, when an actuation state of the electric parking brake changes, the switches in the one switch group are opened and closed in synchronization with each other, and the switches in the other switch group are opened and closed in synchronization with each other. Preferably, when the electric parking brake is actuated and when actuation of the electric parking brake is released, open/closed states of the switches in the one switch group and open/closed states of the switches in the other switch group are selected so as to be different between the groups.

With this configuration, the number of signals for controlling the switching circuit can be reduced, which simplifies the control.

Preferably, when the electric parking brake is actuated, a common terminal of each switch in the one switch group is connected to a normally open terminal of the switch, and a common terminal of each switch in the other switch group is connected to the normally closed terminal of the switch. Preferably, when actuation of the electric parking brake is released, the common terminal of each switch in the one switch group is connected to the normally closed terminal of the switch, and the common terminal of each switch in the other switch group is connected to a normally open terminal of the switch.

Preferably, the fourth switch is the three-way switch, and the switching circuit further includes a fifth line electrically connecting between the normally open terminal of the fourth switch and the first line connected toward the normally closed terminal of the first switch.

A control apparatus according to the present invention includes the above-described switching circuit and an electronic control unit electrically connected to the switching circuit and configured to control an electrical system of a vehicle. The electronic control unit includes a fifth terminal to be electrically connected to the first terminal, a sixth terminal to be electrically connected to the second terminal, a seventh terminal to be electrically connected to the third terminal, and an eighth terminal to be electrically connected to the fourth terminal. The fifth terminal, the sixth terminal, the seventh terminal, and the eighth terminal each have a signal input terminal and a signal detection terminal. A signal input from one of the signal input terminals to an associated terminal of the input/output terminal section passes through a conducting path in the switching circuit, and is detected by an associated one of the signal detection terminals.

With this configuration, in which each terminal of the switching circuit is connected to the associated signal input terminal and the associated signal detection terminal, the conducting state and the conducting path in the switching circuit can be easily detected.

Preferably, in the switching circuit, by connecting a common terminal of the fourth switch to a normally open terminal of the fourth switch, a current for activating the electronic control unit is supplied to an activation terminal of the electronic control unit from the fifth terminal through the fourth switch and the third terminal.

With this configuration, the electronic control unit that is in a sleep state can be returned to an activated state with a simple configuration.

Advantages of the Invention

As described above, the present invention is capable of achieving a switching circuit which enables changes of operational states of the EPB, using a simple configuration and a smaller number of signals, and which includes a smaller number of failure modes that need to be detected.

DESCRIPTION OF EMBODIMENTS

Embodiments will now be described in detail with reference to the drawings. The following description of the preferred embodiments is merely illustrative in nature, and is never intended to limit the scope, applications, or use of the present invention.

First Embodiment (Configuration of Control System of EPB and Switching Circuit)

Figure 1:
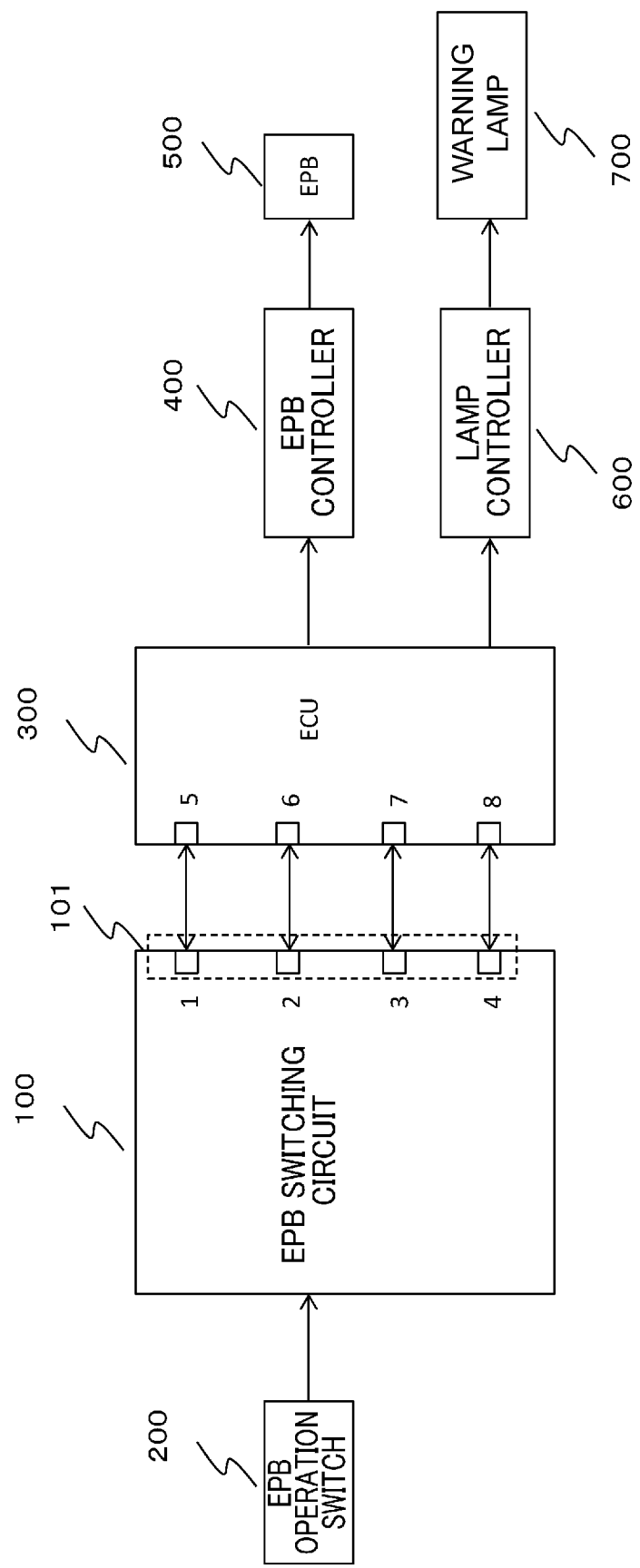
FIG. 1 is a control block diagram of an EPB according to a first embodiment of the present invention.

In the present embodiment, as depicted in FIG. 1, a switching circuit 100 and an electronic control unit (hereinafter referred to as an "ECU") 300 configured to control an electrical system of a vehicle are electrically connected to each other via four input/output terminals (hereinafter called "SW terminals") 1 to 4 of the switching circuit 100 and four input/output terminals (hereinafter called "ECU terminals") 5 to 8 of the ECU 300.

In response to operation of an EPB operation switch 200, a conducting path is changed in the switching circuit 100. A signal is input from the ECU 300 to the switching circuit 100, and based on a signal output from the switching circuit 100, the change of the conducting path in the switching circuit 100, that is, a result of operating the EPB operation switch 200 is detected by the ECU 300. Based on this detected result, a control signal is sent from the ECU 300 to the EPB controller 400, and actuation of the EPB 500 is controlled by the EPB controller 400.

As will be described later, when an electrical failure has been detected in the switching circuit 100, a signal is sent from the ECU 300 to a warning lamp controller 600, whereby a warning lamp 700 is illuminated.

Under normal conditions, the switching circuit 100 is in a neutral state. When a driver operates the EPB operation switch 200 to set the switching circuit 100 into an actuated state or an actuation-released state and then, for example, takes his/her hand off the EPB operation switch 200 to stop the operation, the switching circuit 100 returns to the neutral state. Because such a configuration is a known technique, detailed description thereof is omitted herein.

It should be noted that the ECU 300 performs drive control of an engine, for example, in addition to the actuation control of the EPB 500, but description thereof is omitted herein for concise description.

Without providing the EPB controller 400, the control signal may be sent directly from the ECU 300 to the EPB 500 to control the actuation of the EPB 500.

As depicted in FIG. 1 to FIG. 4, the switching circuit 100 includes an input/output terminal section 101 including the four SW terminals 1 to 4, lines 11 to 14 connecting between these terminals, switches 21 to 24 disposed in paths of the respective lines, and diodes 31 to 34 disposed in the paths of the respective lines.

In the following description, a single-pole switch refers to a switch configured to change between a non-conducting state and a conducting state, and the three-way switch refers to a switch configured to change between two paths that are in the conducting state.

The switch 21 is a single-pole switch, and a common terminal 21a is connected to a normally closed terminal 21b or a normally open terminal 21c in response to operation of the EPB operation switch 200.

The switches 22, 23, and 24 are also single-pole switches, and operate in the same manner as described above.

When connected to the normally closed terminal, the switch is in a closed state, that is, in the conducting state. When connected to the normally open terminal, the switch is in an open state, that is, in the non-conducting state.

When the switch 21 is in the closed state, the SW terminal 1 and the SW terminal 4 are electrically connected to each other by the line 11. In this condition, the switch 21, the diode 31, and a resistance 41 are connected in series in the path of the line 11.

When the switch 22 is in the closed state, the SW terminal 2 and the SW terminal 4 are electrically connected to each other by the line 12 branching off from the line 11. In this condition, the switch 22, the diode 32, and a resistance 42 are connected in series in the path of the line 12.

When the switch 23 is in the closed state, the SW terminal 1 and the SW terminal 3 are electrically connected to each other by the line 13. In this condition, the switch 23, the diode 33, and a resistance 43 are connected in series in the path of the line 13.

When the switch 24 is in the closed state, the SW terminal 2 and the SW terminal 3 are electrically connected to each other by the line 14 branching off from the line 13. In this condition, the switch 24, the diode 34, and a resistance 44 are connected in series in the path of the line 14.

The resistances 41 to 44 are provided so as to restrict currents flowing between the terminals to protect the switches and the diodes. However, when the amounts of the currents are small, these resistances do not have to be provided.

Anodes of the diodes 31 to 34 are connected to the normally closed terminals 21b to 24b of the switches 21 to 24, respectively.

Connecting these anodes in this manner allows currents flowing between the terminals to flow in the same direction even when any one of the switches 21 to 24 is set to the closed state.

For example, a current flows from the SW terminal 4 to the SW terminal 1, but the current does not flow in the reverse direction.

The current flowing from the SW terminal 3 to the SW terminal 1, and the current flowing from the SW terminal 4 or the SW terminal 3 to the SW terminal 2 also does not flow in the reverse direction.

Figure 2:
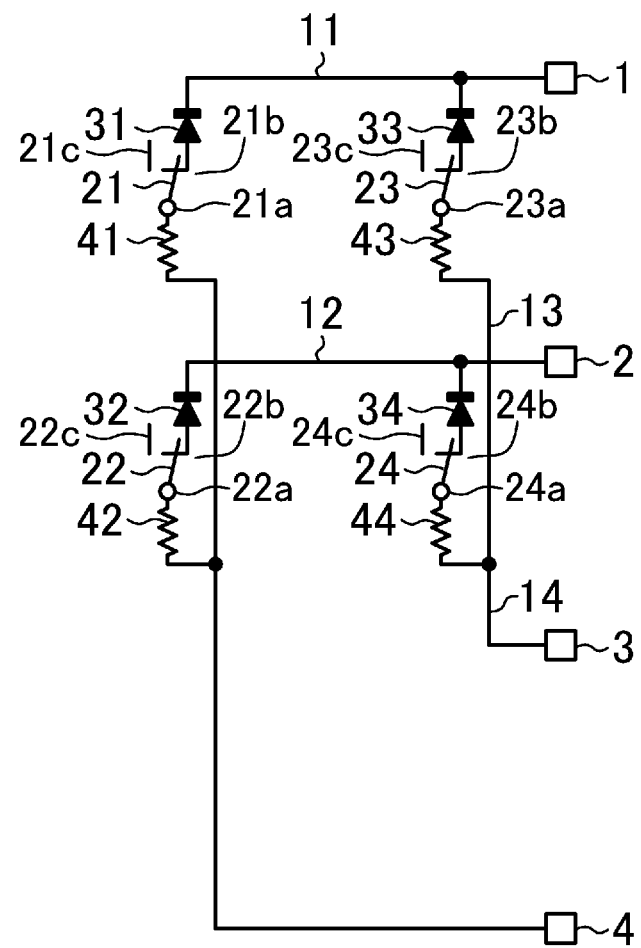
FIG. 2 is a diagram illustrating a configuration of a switching circuit in a neutral state.

As depicted in FIG. 2, the switches 21 to 24 are all in the closed state in the neutral state.

Figure 3:
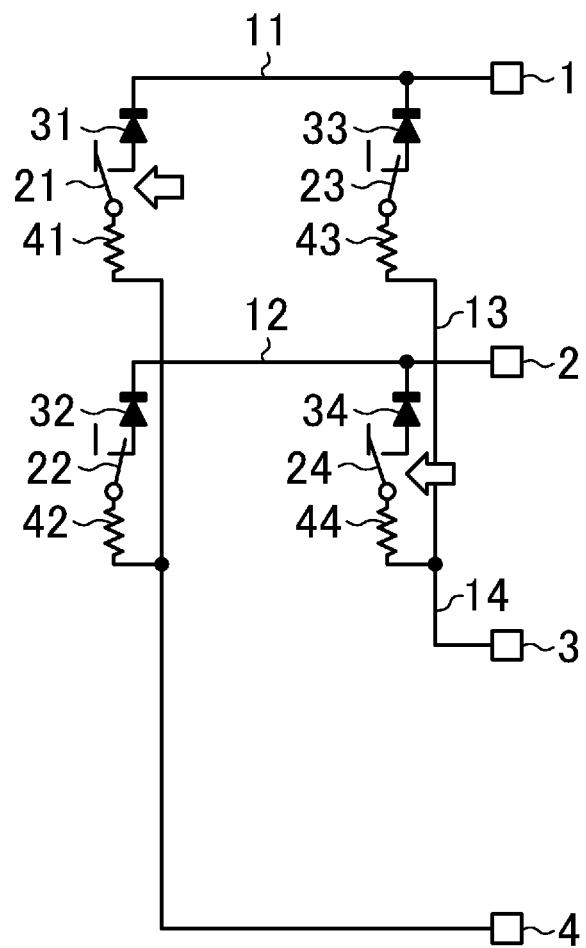
FIG. 3 is a diagram illustrating a configuration of the switching circuit when the EPB is in an actuated state.

As depicted in FIG. 3, when the EPB 500 is in the actuated state, the switches 21 and 24 are in the open state, and the switches 22 and 23 are in the closed state.

Figure 4:
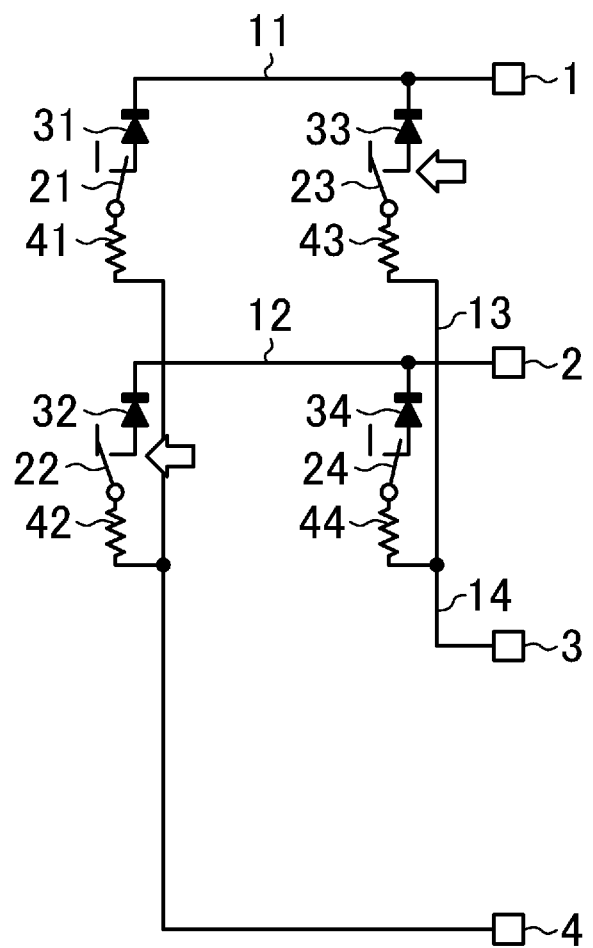
FIG. 4 is a diagram illustrating a configuration of the switching circuit when the EPB is in an actuation-released state.

As depicted in FIG. 4, when the EPB 500 is in the actuation-released state, the switches 21 and 24 are in the closed state, and the switches 22 and 23 are in the open state.

In other words, in the switching circuit 100, based on the result of operation of the EPB operation switch 200, the switches 21 and 24 are opened and closed in synchronization with each other as one switch group, and the switches 22 and 23 are opened and closed in synchronization with each other as another switch group.

(Signal Detection at ECU in Response to Change in State of Switching Circuit)

Figure 5:
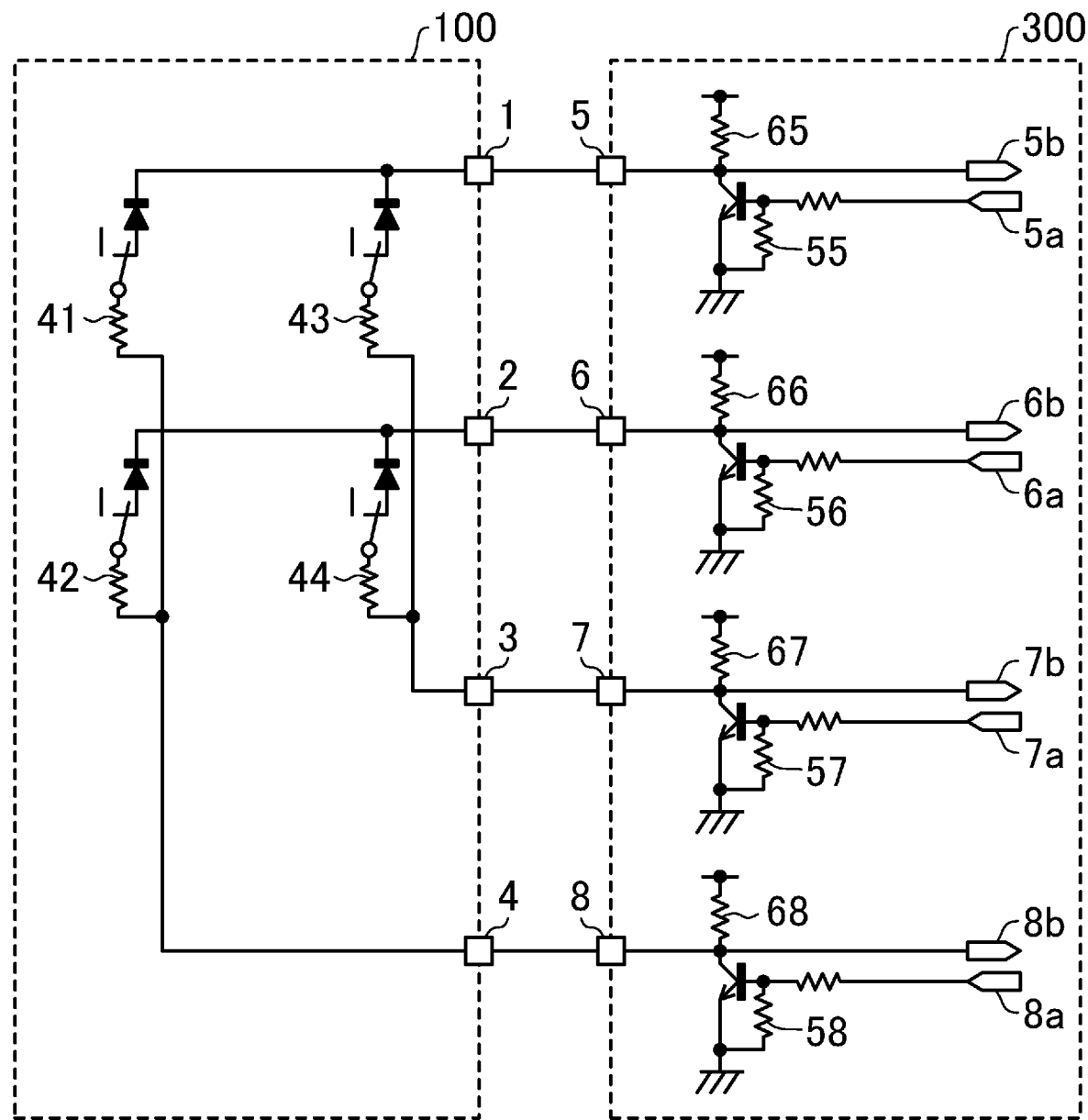
FIG. 5 is a diagram illustrating a circuit configuration of a connecting portion between the switching circuit and the ECU.

As depicted in FIG. 5, signal input terminals 5a to 8a and signal detection terminals 5b to 8b are connected to the ECU terminals 5 to 8, respectively, inside the ECU 300.

Relations of connections between the respective terminals will be described with reference to the ECU terminal 5, the signal input terminal 5a, and the signal detection terminal 5b taken as an example.

The base of an NPN transistor 55 that is a switching element is connected to the signal input terminal 5a, and the collector of the NPN transistor 55 is connected to the signal detection terminal 5b. The emitter of the NPN transistor 55 is connected to the ground (hereinafter, called "GND") potential, thereby forming a grounded emitter circuit. A predetermined voltage (+12 V) is applied to the signal detection terminal 5b, via a protective resistance 65, from a battery (not depicted) that is a power supply mounted on the vehicle.

The signal input terminals 6a to 8a and the signal detection terminals 6b to 8b which are connected to the ECU terminals 6 to 8, respectively, are configured in the same manner as described above.

With the above-described configuration, signals input from the signal input terminals 5a to 8a to the SW terminals 1 to 4 via the NPN transistors 55 to 58, respectively, are detected by the signal detection terminals 5b to 8b via conducting paths in the switching circuit 100. In accordance with changes of the conducting paths in the switching circuit 100, the detected signals are modulated.

Figure 6:
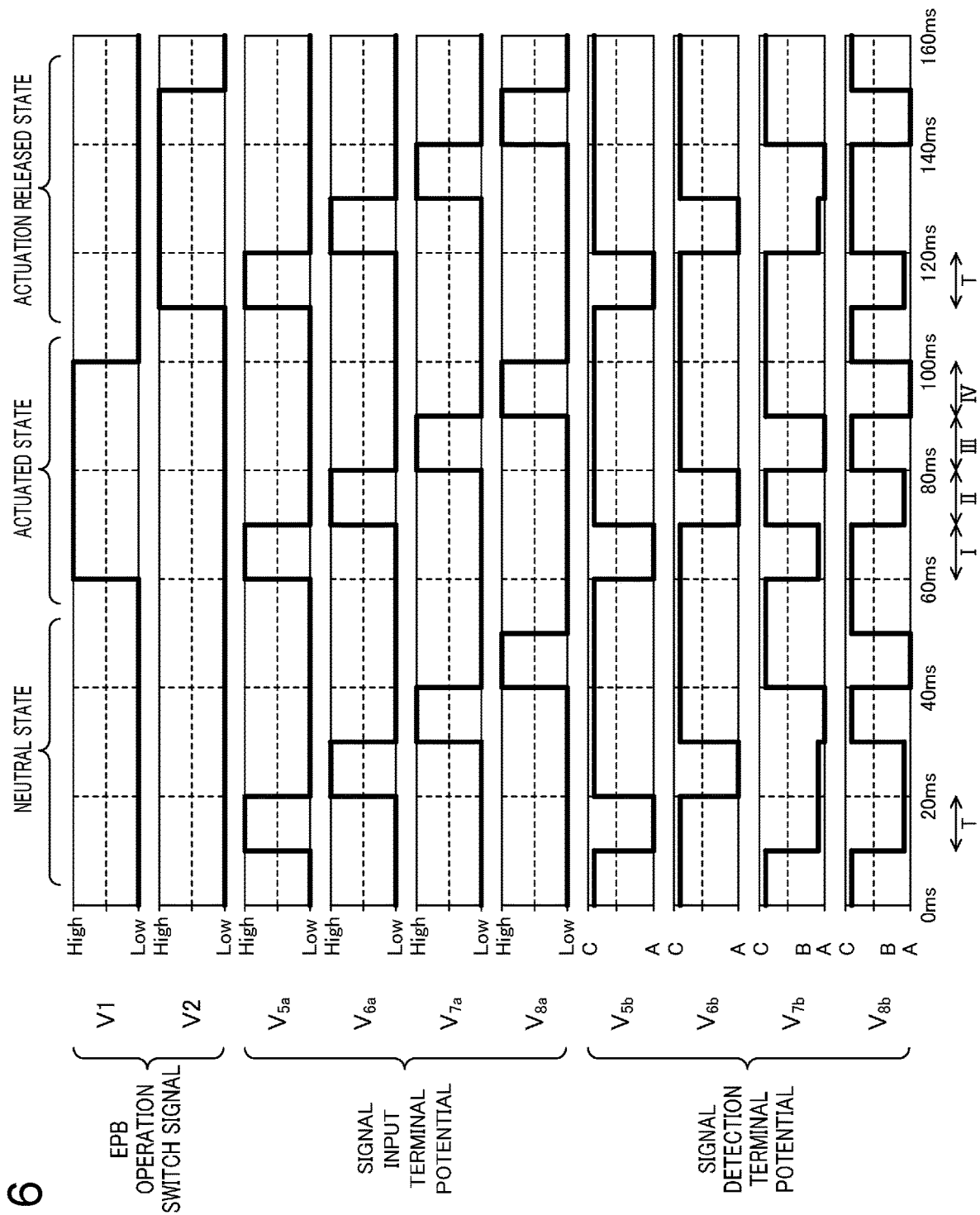
FIG. 6 is a time chart illustrating changes in potentials at signal input terminals of the ECU and potentials at signal detection terminals of the ECU over time.

As depicted in FIG. 6, the actuation state of the EPB 500 is changed depending on signals V1 and V2 generated in response to operation of the EPB operation switch 200.

When the potentials of both of V1 and V2 are Low, the switching circuit 100 is in the neutral state. When the potential of V1 is High and the potential of V2 is Low, the switching circuit 100 is set to the actuated state. When the potential of V1 is Low and the potential of V2 is High, the switching circuit 100 is set to the actuation-released state.

The conducting path in the switching circuit 100 is different between the respective cases. Thus, when the potentials at the signal input terminals 5a to 8a of the ECU 300 are changed in turn at regular time intervals T, potentials that are different depending on changes of the conducting paths inside the switching circuit 100 are detected at the signal detection terminals 5b to 8b of the ECU 300.

By measuring these potential changes, the conducting state inside the switching circuit 100, that is, the result of operating the EPB operation switch 200 can be detected by the ECU 300. Furthermore, a failure that occurs inside the switching circuit 100 can be detected as will be described later.

In the present embodiment, the time interval T is set to 20 milliseconds. However, it is not limited thereto. The time interval can be appropriately changed depending, for example, on design specifications and actual use conditions of the switching circuit 100 and the ECU 300.

Potential changes at the signal detection terminals 5b to 8b of the ECU 300 when the switching circuit 100 is in the actuated state will be described first.

During a period I in FIG. 6, the potential input from the signal input terminal 5a to the NPN transistor 55 is High, and the potentials input from the other signal input terminals to the NPN transistors connected to the respective terminals are Low.

In this case, the path between the SW terminal 1 and the SW terminal 3 is in the conducting state via the resistance 43, the switch 23, and the diode 33. Because the NPN transistor 55 is turned on, the signal detection terminal 5b is connected to the GND potential via the NPN transistor 55. Thus, a current flows from the signal detection terminal 7b to the GND potential through the SW terminal 3, the conducting path in the switching circuit 100, and the SW terminal 1.

At this time, the potential at the signal detection terminal 5b becomes a potential A that is higher than Low. The potential Low is substantially the same as the GND potential. The potential A is different from the GND potential because it is influenced by an internal voltage of the NPN transistor 55.

The potential at the signal detection terminal 7b becomes a potential B. The potential B is a value obtained depending on the internal voltage between the collector and the emitter of the NPN transistor 55, the forward voltage in the diode 33, and a voltage drop due to resistances in the path.

Herein, because the switch 22 is in the closed state, the path between the SW terminal 2 and the SW terminal 4 is continuous. Because the potentials output from the signal input terminals 6a and 8a are both Low, the NPN transistors 56 and 58 do not become active, and thus the respective signal detection terminals 6b and 8b are not connected to the GND potential.

In this case, because the potentials at both ends of the diode 32 are substantially the same, the diode 32 is not conductive, and thus a current does not flow between the signal detection terminals 6b and 8b.

Thus, the potentials at the signal detection terminals 6b and 8b become a potential C. The potential C is substantially the same as the potential at the positive terminal of the battery that is a power supply.

During a period II in FIG. 6, the potential output from the signal input terminal 6a is High, and the potentials input from the other signal input terminals are Low.

The open/closed states of the switches 21 to 24 are the same as those during the period I, but the path between the SW terminals 2 and 4 is in the conducting state unlike the state indicated during the period I. Thus, a current flows from the signal detection terminal 8b to the GND potential through the SW terminal 4, the conducting path in the switching circuit 100, and the SW terminal 2.

At this time, the potential at the signal detection terminal 6b becomes the potential A, and the potential at the signal detection terminal 8b becomes the potential B.

These potentials are thus determined due to the same reason as described above.

Because the switch 23 is in the closed state, the path between the SW terminal 1 and the SW terminal 3 is continuous, but a current does not flow between the signal detection terminals 5b and 7b due to the same reason as described above.

Thus, the potentials at the signal detection terminals 5b and 7b become the potential C.

During a period III indicated in FIG. 6, the potential output from the signal input terminal 7a is High, and the potentials output from the other signal input terminals are Low.

In this case, neither the diode 32 nor the diode 33 is conductive. Thus, the potential at the signal detection terminal 7b becomes the potential A, and the potentials at the other signal detection terminals become the potential C.

During a period IV indicated in FIG. 6, the potential output from the signal input terminal 8a is High, and the potentials output from the other signal input terminals are Low.

In this case, neither the diode 32 nor the diode 33 is conductive. Thus, the potential at the signal detection terminal 8b becomes the potential A, and the potentials at the other signal detection terminals become the potential C.

An example has been described above in which the switching circuit 100 is in the actuated state. However, also when the switching circuit is in the neutral state or the actuation-released state, the state of the switching circuit 100, that is, the operational state of the EPB 500 can be detected by changing the potentials of signals input from the signal input terminals 5a to 8a at regular time intervals T to read the potential changes at the signal detection terminal 5b to 8b as described above.

Furthermore, if the potentials detected at the signal detection terminals are different from those during normal operation, this difference can be considered to be caused by an internal failure of the switching circuit 100, and thus this failure can be detected by measuring the potentials of the signal detection terminals.

A faulty signal sent from the ECU 300, such as when the potential High should be output but the potential Low is output instead or when only a potential between the potential High and the potential Low can be output, can be detected by monitoring the potentials at the signal input terminals 5a to 8a.

According to the present embodiment, the single-pole switches are used, and accordingly the number of contacts of the switches in the switching circuit 100 is four that is the same as the number of the normally closed terminals. Thus, the number of the contacts can be reduced to one-half of that in the conventional configuration disclosed in Patent Document 1.

A faulty contact of a switch may be a cause of a failure of the switching circuit 100.

According to the present embodiment, the single-pole switches are used, and accordingly the number of contacts positioned in a path through which a current flows is small. Thus, the number of failure modes that need to be detected can be reduced, and a time for failure detection and analysis can be reduced.

According to the present embodiment, a simple configuration is used in which, with respect to the four terminals of the switching circuit 100, the same number of lines, switches, and diodes are disposed in the paths of the respective lines. Thus, a smaller number of components is required, which makes it possible to reduce the number of failure modes that need to be detected and hence reduce time for failure detection and analysis.

Furthermore, the switches in the two switch groups are opened and closed in synchronization with each other, and also the open/closed states of the switches are made different between the switch groups to change the actuation of the EPB 500. Thus, the number of signals for actuating the switching circuit 100 can be reduced, which simplifies the control.

Second Embodiment

Figure 7:
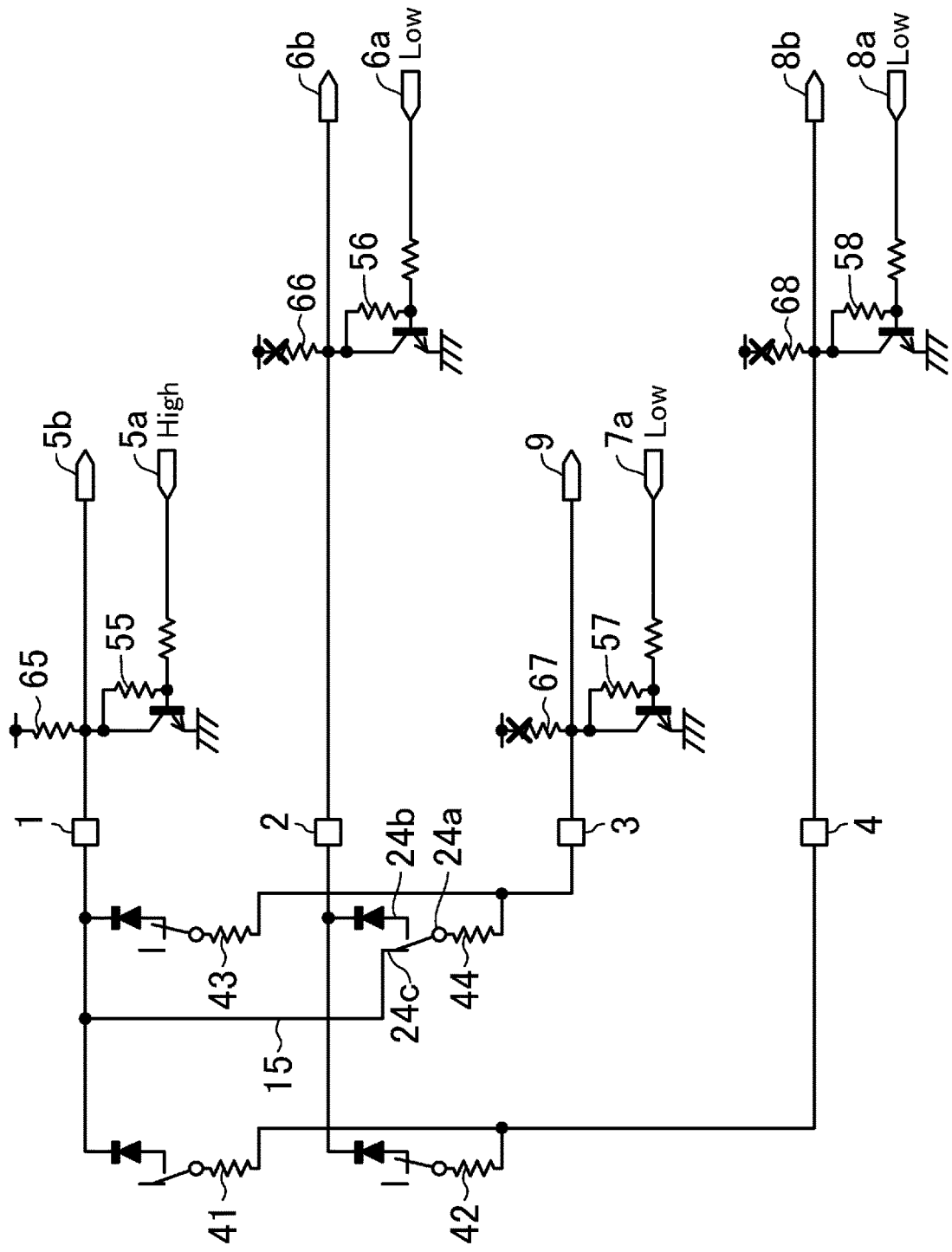
FIG. 7 is a diagram illustrating a flow of a current in a switching circuit according to a second embodiment.

FIG. 7 illustrates a flow of a current in a switching circuit according to the present embodiment, and the configuration therein is different in the following three points from the configuration described in the first embodiment.

The first point is that the switch 24 is a three-way switch. The second point is that the normally open terminal 24c of the switch 24 and the SW terminal 1 are connected to each other by a line 15 and the line 11. The third point is that the SW terminal 3 and a wake-up port 9 of the ECU 300 are connected to each other.

With this configuration, operation of actuating the EPB 500 can be detected even when the ignition is turned off and the ECU 300 is in a sleep state (low power consumption state).

This point will be described below.

As depicted in FIG. 7, when the switching circuit 100 is in the actuated state, the SW terminal 1 and the SW terminal 3 are connected to each other via the switch 24, the line 15, and the line 11, and thus the path between these two terminals is in the conducting state. The line 15 connects the normally open terminal 24c of the switch 24 to a portion of the line 11 between the SW terminal 1 and the cathode of the diode 31.

Herein, the SW terminal 3 is connected to the wake-up port 9 that is an activation terminal in the ECU 300.

When the ECU 300 is in the sleep state, no signal is input to the signal input terminals 5a to 8a, and the NPN transistors 55 to 58 are in an off state.

In this case, the diode 32 is not conductive, and thus a current does not flow between the SW terminal 2 and the SW terminal 4.

Even when the ECU 300 is in the sleep state, the wiring is set such that the voltage of the positive terminal of the battery is applied to signal detection terminal 5b. This voltage is not applied to the other signal detection terminals.

Because the path between the SW terminal 1 and the SW terminal 3 is in the conducting state and the SW terminal 1 has a higher potential, a current flows from the SW terminal 1 toward the SW terminal 3. The current flowing to the SW terminal 3 is input directly to the wake-up port 9, and whereby the ECU 300 is returned from the sleep state to the normal operation state.

As described above, according to the present embodiment, a normally open terminal of a switch that is in the open state in a path of a line connected to a certain SW terminal, the potential at which is lower than those at the other SW terminals, is connected to a line connected to any one of the other SW terminals. This enables a current to flow to the ECU 300 via the SW terminals without operation of the ECU 300, thereby making it possible to return the ECU 300 to the normal state from the sleep state.

In addition, the normally open terminal of the switch that is in the open state is connected to the other SW terminal when the switching circuit 100 is set to the actuated state through the operation of the EPB operation switch 200. This makes it possible to detect whether an actuating operation is performed on the EPB 500, even when the ECU 300 is in the sleep state.

In the present embodiment, an example has been described in which the switch 24 is a three-way switch. Instead, the switch 21 may be a three-way switch. In that case, the line 15 is routed so as to connect between the normally open terminal 21c of the switch 21 and a portion of the line 12 between the SW terminal 2 and the cathode of the diode 32. In this case, the voltage of the positive terminal of the battery is applied to the signal detection terminal 6b, and the wake-up port 9 is connected to the SW terminal 4.

Third Embodiment

Detection of a failure of the switching circuit 100 will be described in the present embodiment.

In this embodiment, the switching circuit 100 to be checked and the connection relationship between the switching circuit 100 and the ECU 300 are those described in the second embodiment. A case in which the switching circuit 100 is in the neutral state will be described, but depending on failure modes, failure detection in a different state will be described.

(First Failure Mode—Wire Break Fault—)

Figure 9:
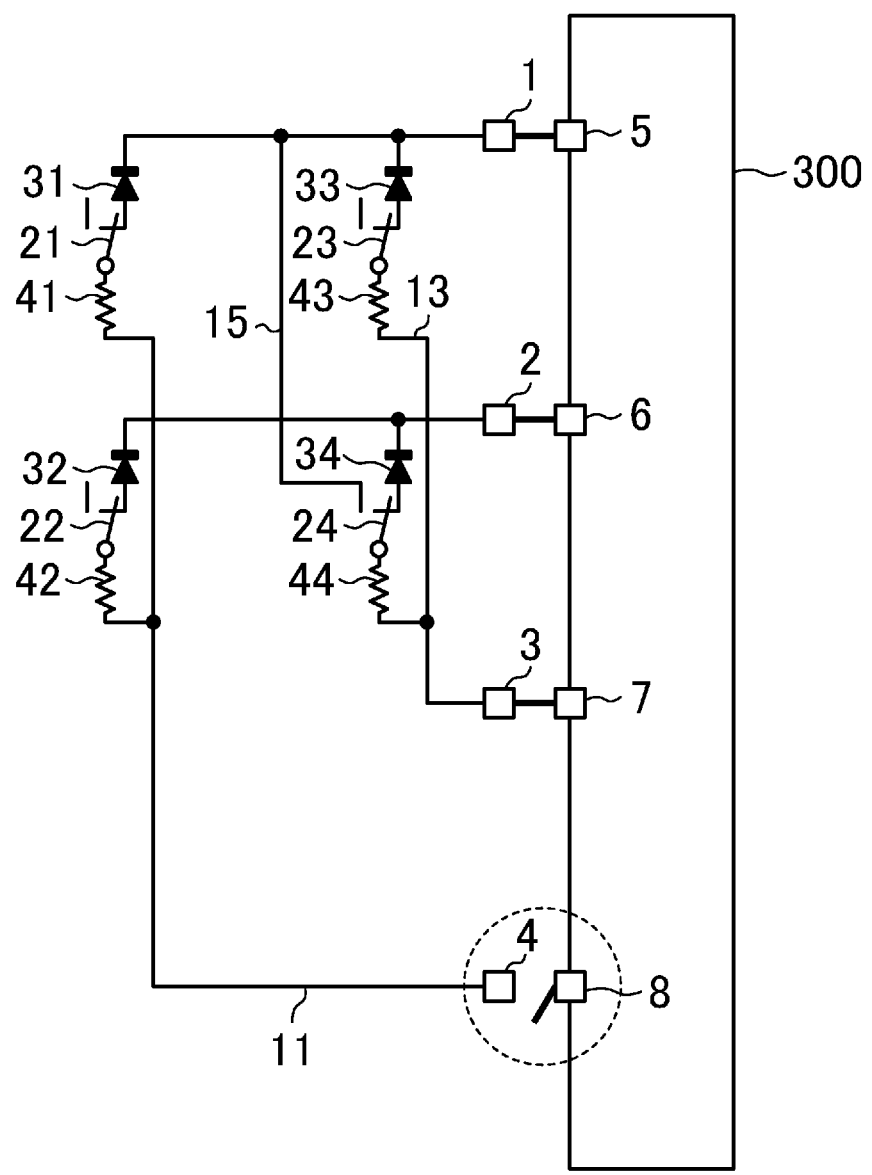
FIG. 9 is a diagram indicating a fault location of a first failure mode.

When a harness between the SW terminal 4 and the ECU terminal 8 has broken as depicted in FIG. 9, a current does not flow to the SW terminal 4. When the line 11 has broken in the switching circuit 100, the current does not flow either.

In this case, the potential at the signal detection terminal 8b simply follows the potential at the signal input terminal 8a, regardless of changes in the conducting state in the switching circuit 100.

Figure 8:
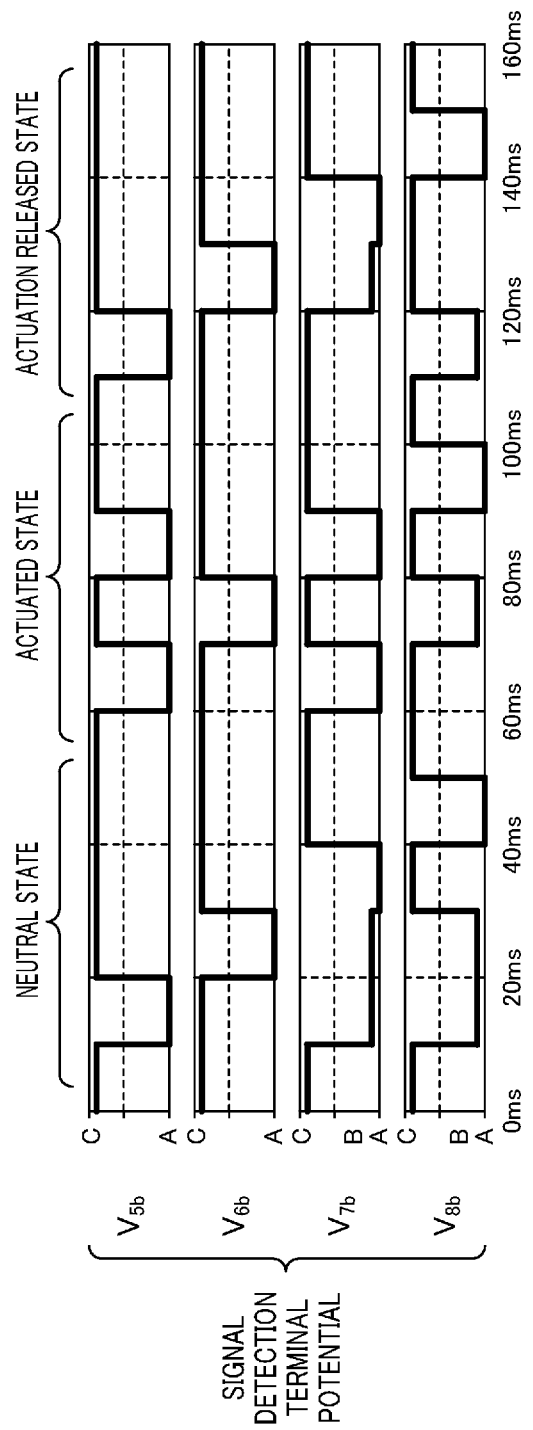
FIG. 8 is a time chart illustrating changes in potentials at the signal detection terminals of the ECU during normal operation over time according to a third embodiment.
Figure 10:
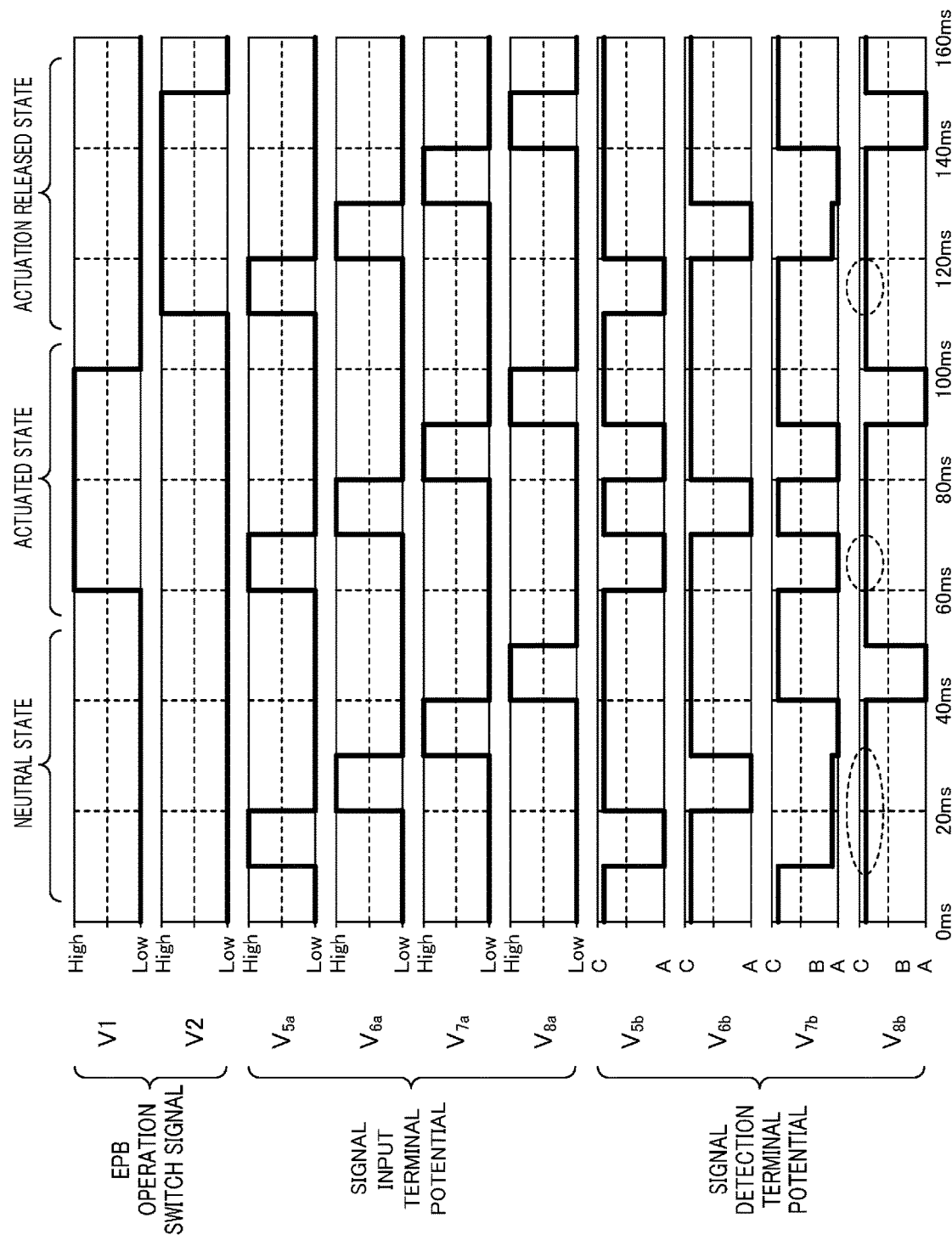
FIG. 10 is a time chart illustrating changes in potentials at the signal input terminals of the ECU and potentials at the signal detection terminals of the ECT over time in the first failure mode.

In FIG. 10, potential changes in areas surrounded by dotted circles are different from those during normal operation (see FIG. 8). By comparing the potential change patterns therebetween, the occurrence of a failure can be detected, and the failure mode can be identified.

As depicted in FIG. 8 and FIG. 10, in all of the cases in which the switching circuit 100 is in the neutral state, the actuated state, and the actuation-released state, the potential changes of the signal detection terminals 5b to 7b corresponding to the potential changes of the signal input terminals 5a to 7a are the same as those during normal operation.

Thus, if a wire break fault is detected and the fault location thereof can be identified, the operating state of the EPB 500 can be estimated.

(Second Failure Mode—Wiring Ground Fault—)

In general, GND has the same potential as that of the body of the vehicle, and the negative terminal of the battery is also connected to the GND potential.

Figure 11:
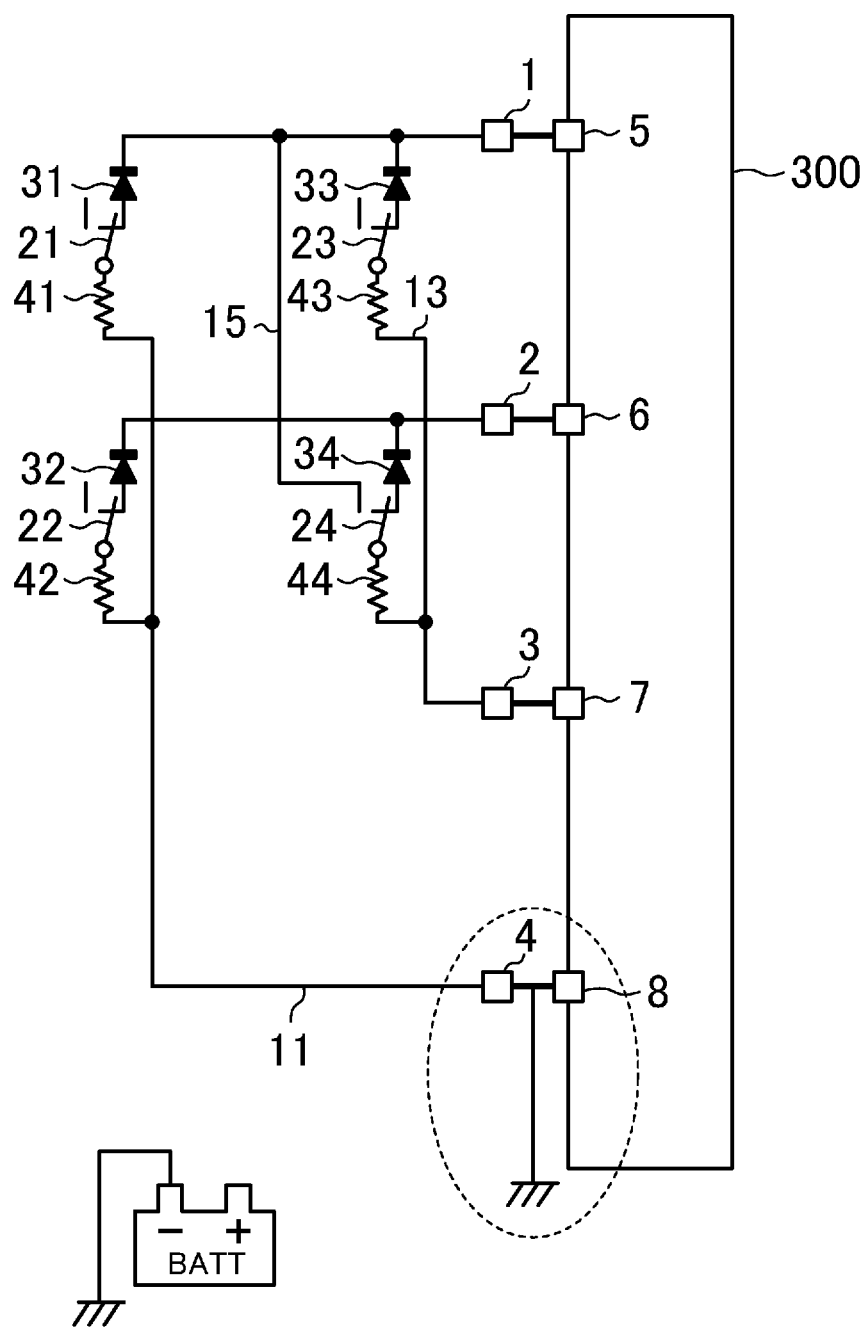
FIG. 11 is a diagram indicating a fault location of a second failure mode.

Thus, when a harness between the SW terminal 4 and the ECU terminal 8 is short-circuited to the ground as depicted in FIG. 11, the potentials at the SW terminal 4 and the ECU terminal 8 become the GND potential. Similarly, when the line 11 in the switching circuit 100 is short-circuited to the ground, the potentials at these terminals become the GND potential, too.

Figure 12:
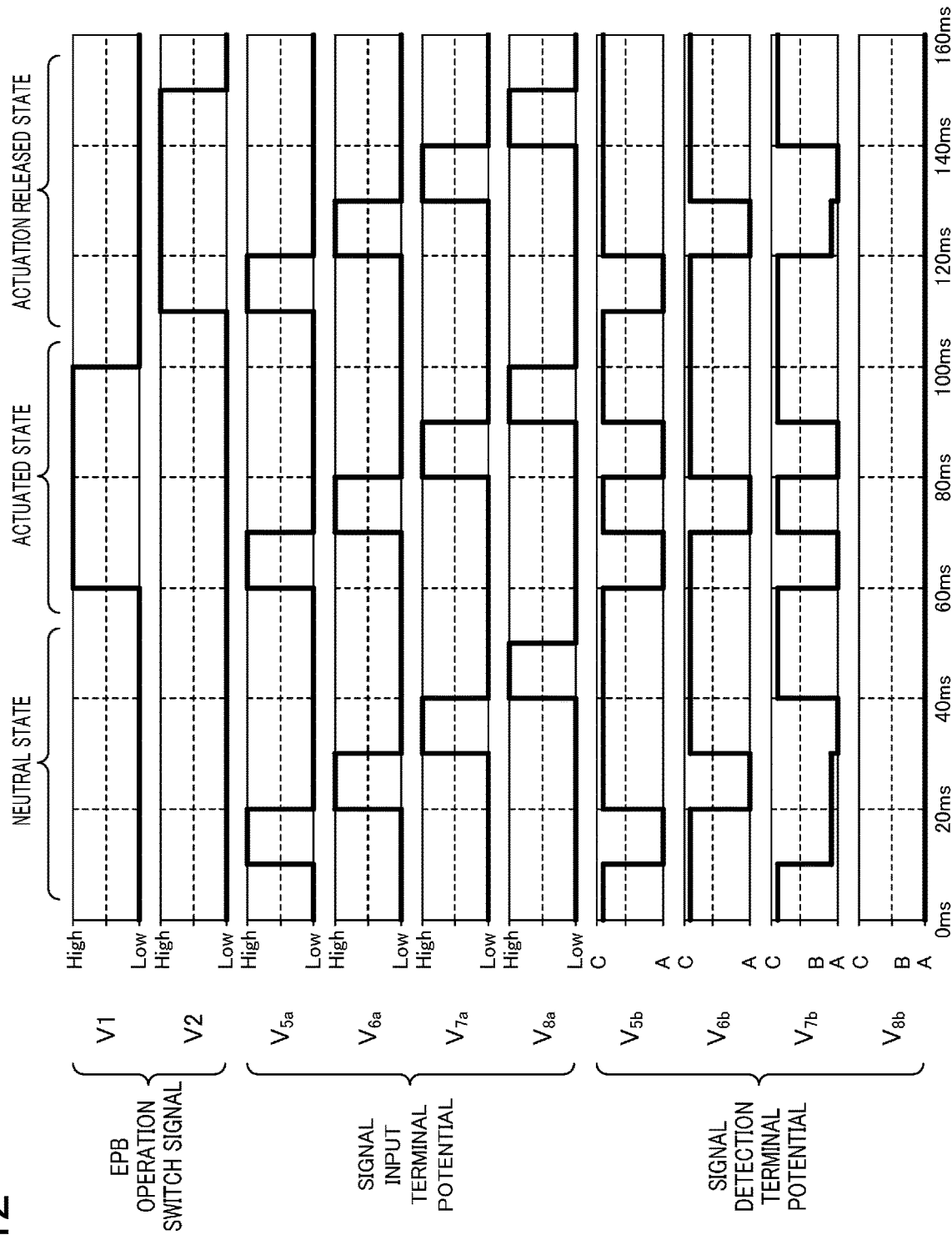
FIG. 12 is a time chart illustrating changes in potentials at the signal input terminals of the ECU and potentials at the signal detection terminals of the ECT over time in the second failure mode.

As depicted in FIG. 12, the potential at the signal detection terminal 8b is fixed at the GND potential, regardless of the potential changes at the signal input terminal 8a or changes in the conducting state in the switching circuit 100. Thus, a failure can be detected and the failure mode can be identified by comparing the potential changes with those during normal operation (see FIG. 8).

As depicted in FIG. 8 and FIG. 12, in all of the cases in which the switching circuit 100 is in the neutral state, the actuated state, and the actuation-released state, the potential changes at the signal detection terminals 5*b* to 7*b* corresponding to the potential changes at the signal input terminals 5*a* to 7*a* are the same as those during normal operation.

Thus, if a ground fault is detected and the fault location thereof can be identified, the operating state of the EPB 500 can be estimated.

(Third Failure Mode—Wiring Power-Supply Fault—)

The power-supply fault refers to a failure in which a SW terminal comes into contact with the potential of the positive terminal of the battery and accordingly the potential at the SW terminal is fixed at the potential of the positive terminal of the battery.

Figure 13:
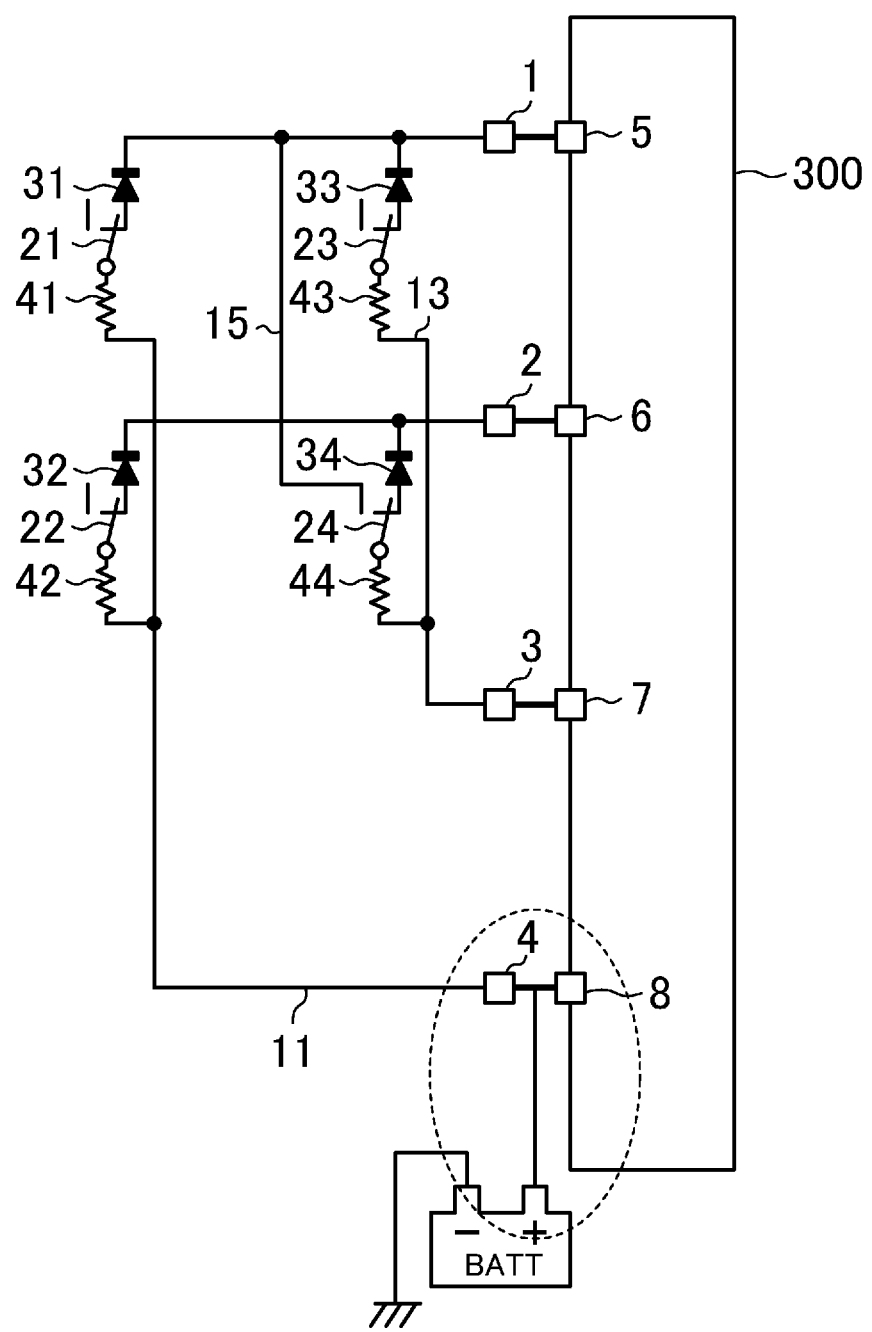
FIG. 13 is a diagram indicating a fault location of a third failure mode.

Thus, when a harness between the SW terminal 4 and the ECU terminal 8 has been short-circuited to the power supply as depicted in FIG. 13, the potentials at the SW terminal 4 and the ECU terminal 8 are fixed at the potential of the positive terminal of the battery.

Similarly, when the line 11 in the switching circuit 100 is short-circuited to the power supply, the potentials at these terminals are fixed at the potential of the positive terminal of the battery, too.

Figure 14:
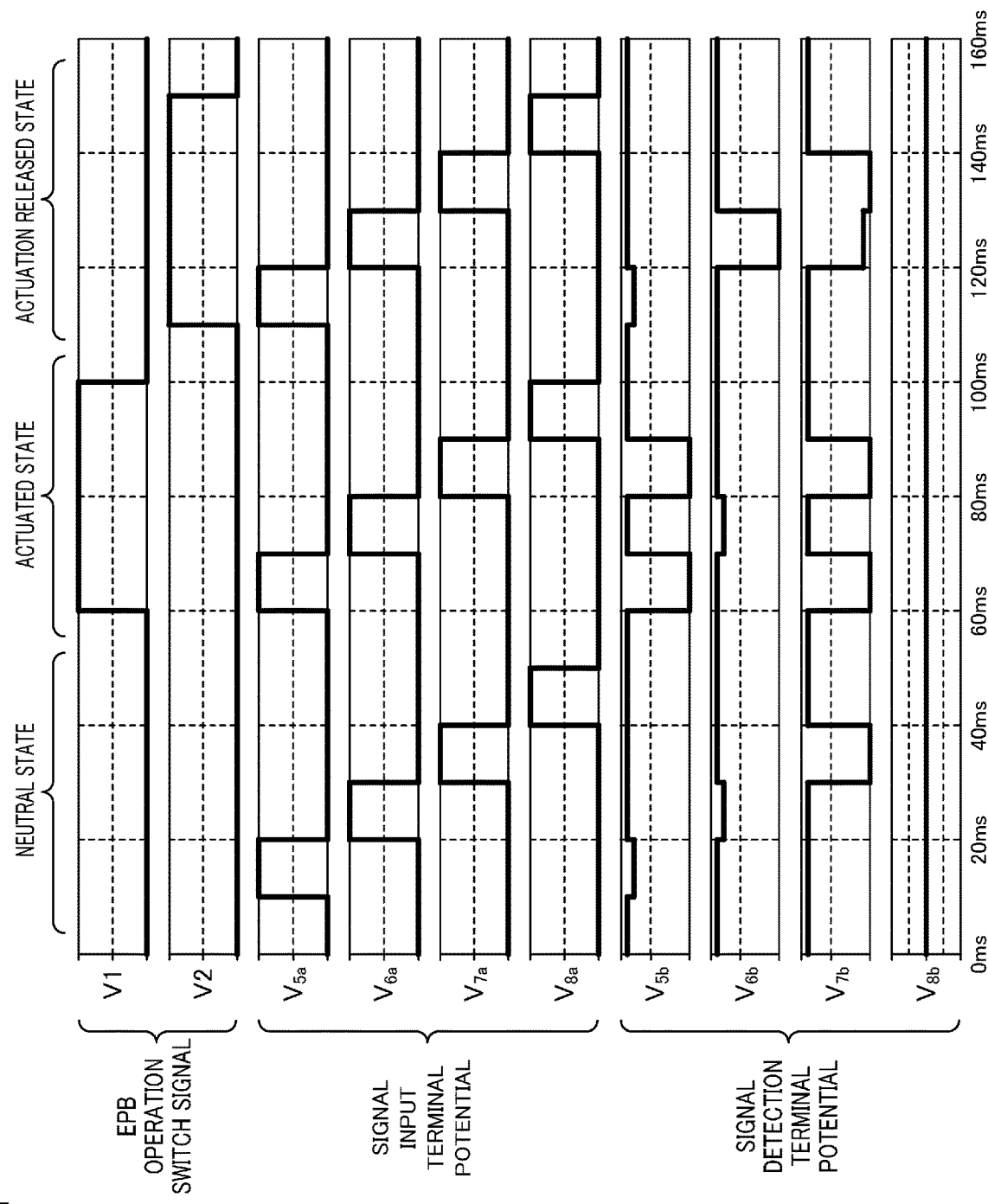
FIG. 14 is a time chart illustrating changes in potentials at the signal input terminals of the ECU and potentials at the signal detection terminals of the ECT over time in the third failure mode.

As depicted in FIG. 14, the potential at the signal detection terminal 8*b* is fixed at the potential of the positive terminal of the battery, regardless of the potential changes at the signal input terminal 8*a* or changes in the conducting state in the switching circuit 100. Thus, a failure can be detected and the failure mode can be identified by comparing the potential changes with those during normal operation (see FIG. 8).

As depicted in FIG. 8 and FIG. 14, in all of the cases in which the switching circuit 100 is in the neutral state, the actuated state, and the actuation-released state, the potential changes at the signal detection terminals 5*b* to 7*b* corresponding to the potential changes at the signal input terminals 5*a* to 7*a* are different from those during normal operation due to the influence of the power-supply fault.

However, if potential change patterns at the time of a power-supply fault are known, the operating state of the EPB 500 can be estimated by comparing the potential change patterns with those during normal operation.

(Fourth Failure Mode—Stuck Switch Fault—)

The stuck switch fault refers to a failure in which a switch in the switching circuit 100 is stuck in the open state or in the closed state, and the open/closed state of the switch cannot be changed even when a signal for changing the actuation is input.

Figure 15:
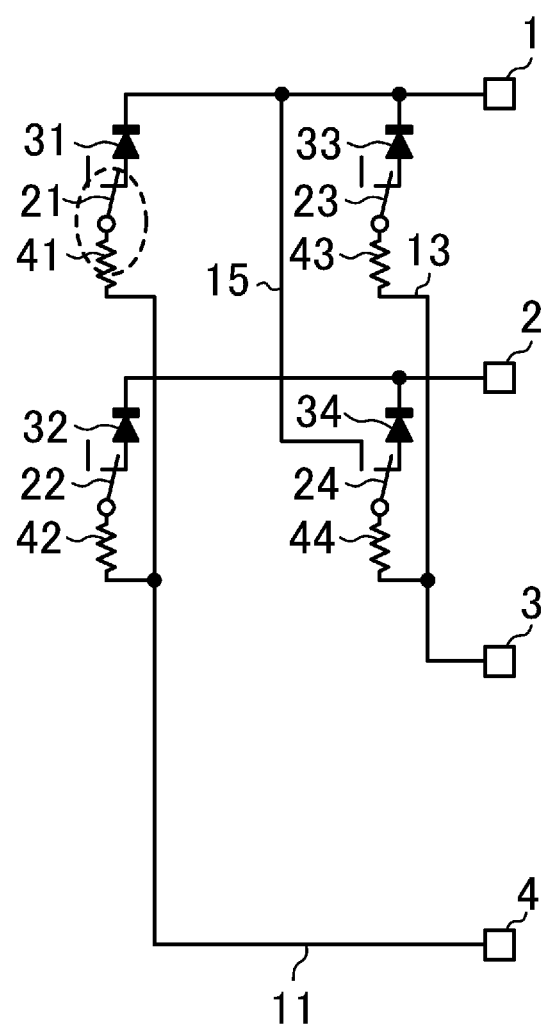
FIG. 15 is a diagram indicating a fault location of a fourth failure mode.

A case in which the switch 21 is stuck in the closed state, as depicted in FIG. 15, will be described below.

In such a case, with reference to FIG. 2 to FIG. 4, abnormal conditions occur in potential changes at a signal detection terminal only when the switch 21 is in the open state, that is, when the switching circuit 100 is in the actuated state.

Figure 16:
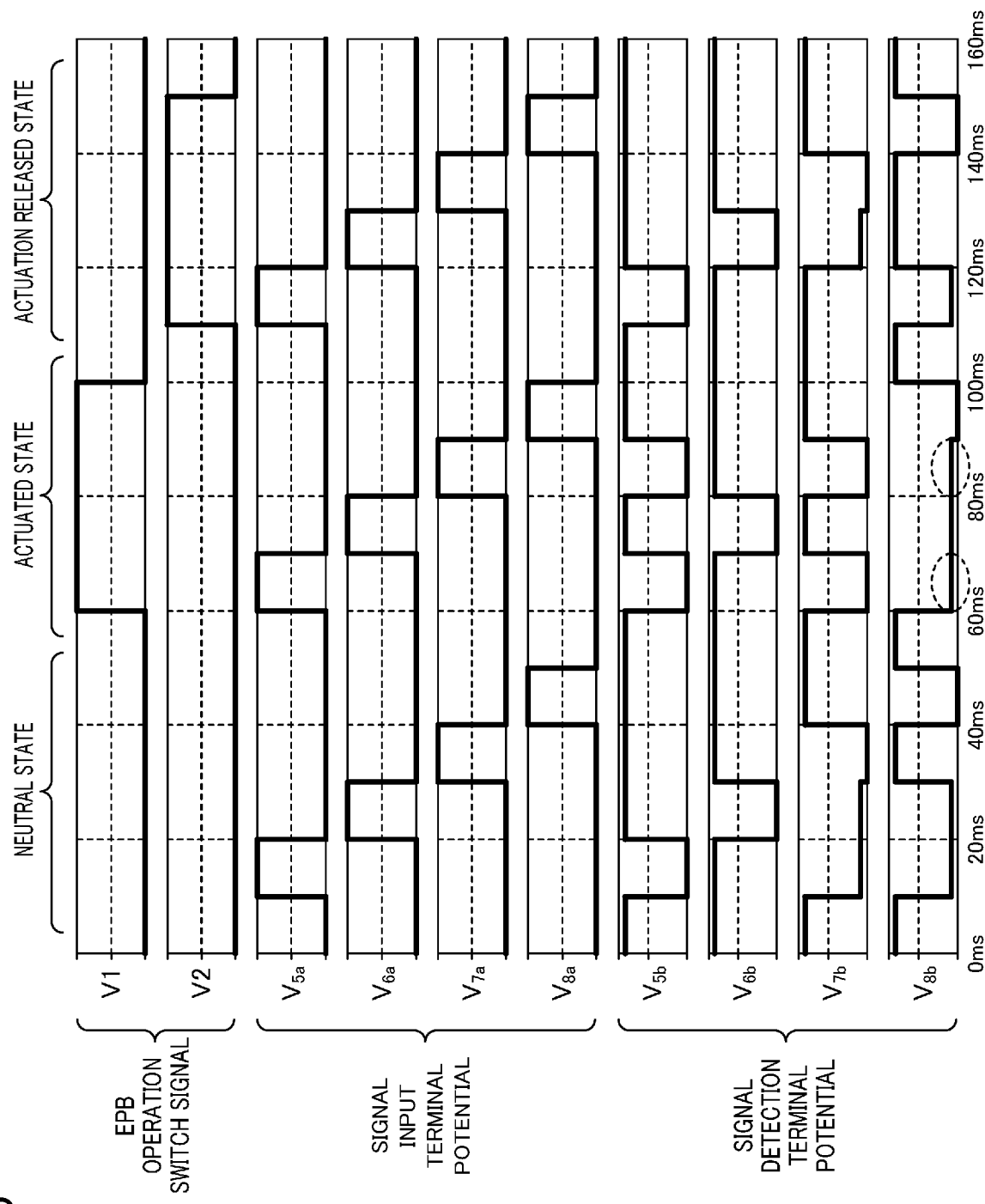
FIG. 16 is a time chart illustrating changes in potentials at the signal input terminals of the ECU and potentials at the signal detection terminals of the ECT over time in the fourth failure mode.

In FIG. 16, potential changes in areas surrounded by dotted circles are different from those during normal operation (see FIG. 8). By comparing the potential change patterns therebetween, the occurrence of a failure can be detected, and the failure mode can be identified.

In this case, the potential at the signal detection terminal 8*b* is supposed to be the potential C even if the potential at the signal input terminal 5*a* is set to Low, because a current is not intended to flow to the SW terminal 4.

In reality, however, a current flows between the SW terminal 4 and the SW terminal 1 through the switch 21 and the line 11 because the switch 21 is in the closed state, and the potential at the signal detection terminal 8*b* is the potential B.

Similarly, the potential at the signal detection terminal 8*b* is supposed to be the potential C even if the potential at the signal input terminal 8*a* is set to Low, because a current is not intended to flow to the SW terminal 4.

In reality, however, a current flows between the SW terminal 4 and the SW terminal 1 through the switch 21 and the line 11 because the switch 21 is in the closed state, and the potential at the signal detection terminal 8*b* is the potential B.

By comparing these potential changes with the potential changes during normal operation (see FIG. 8), the occurrence of a failure can be detected, and the failure mode can be identified.

As depicted in FIG. 8 and FIG. 16, in all of the cases in which the switching circuit 100 is in the neutral state, the actuated state, and the actuation-released state, the potential changes at the signal detection terminals 5*b* to 7*b* corresponding to the potential changes at the signal input terminals 5*a* to 7*a* are the same as those during normal operation.

Thus, if a stuck switch fault is detected and the fault location thereof can be identified, the operating state of the EPB 500 can be estimated.

(Fifth Failure Mode—Diode Open Fault)

The diode open fault refers to a failure in which a diode in the switching circuit 100 has lost its rectification characteristics and become non-conductive.

Figure 17:
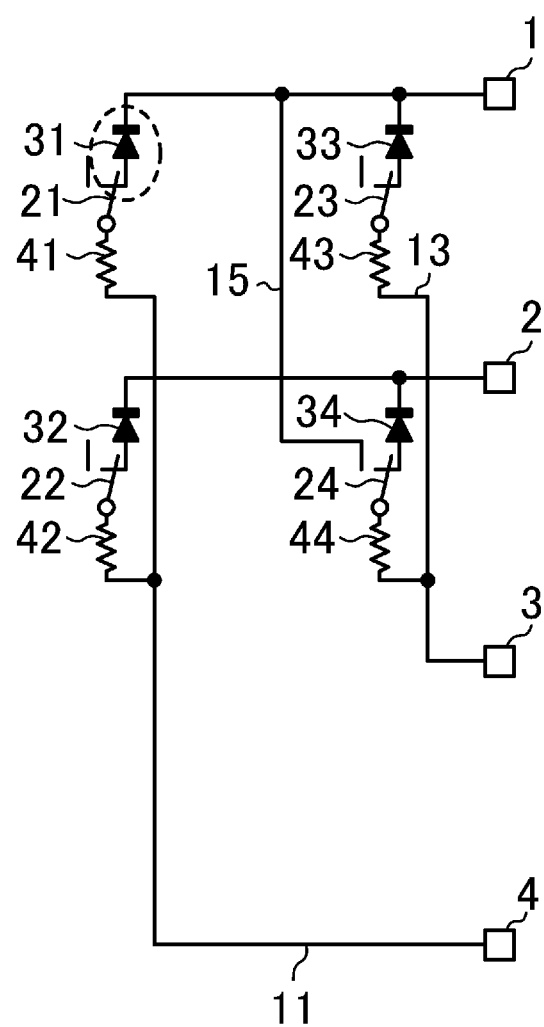
FIG. 17 is a diagram indicating a fault location of fifth and sixth failure modes.

A case in which a failure occurs in the diode 31 as depicted in FIG. 17, specifically a case in which the diode 31 is left open, will be described.

Figure 18:
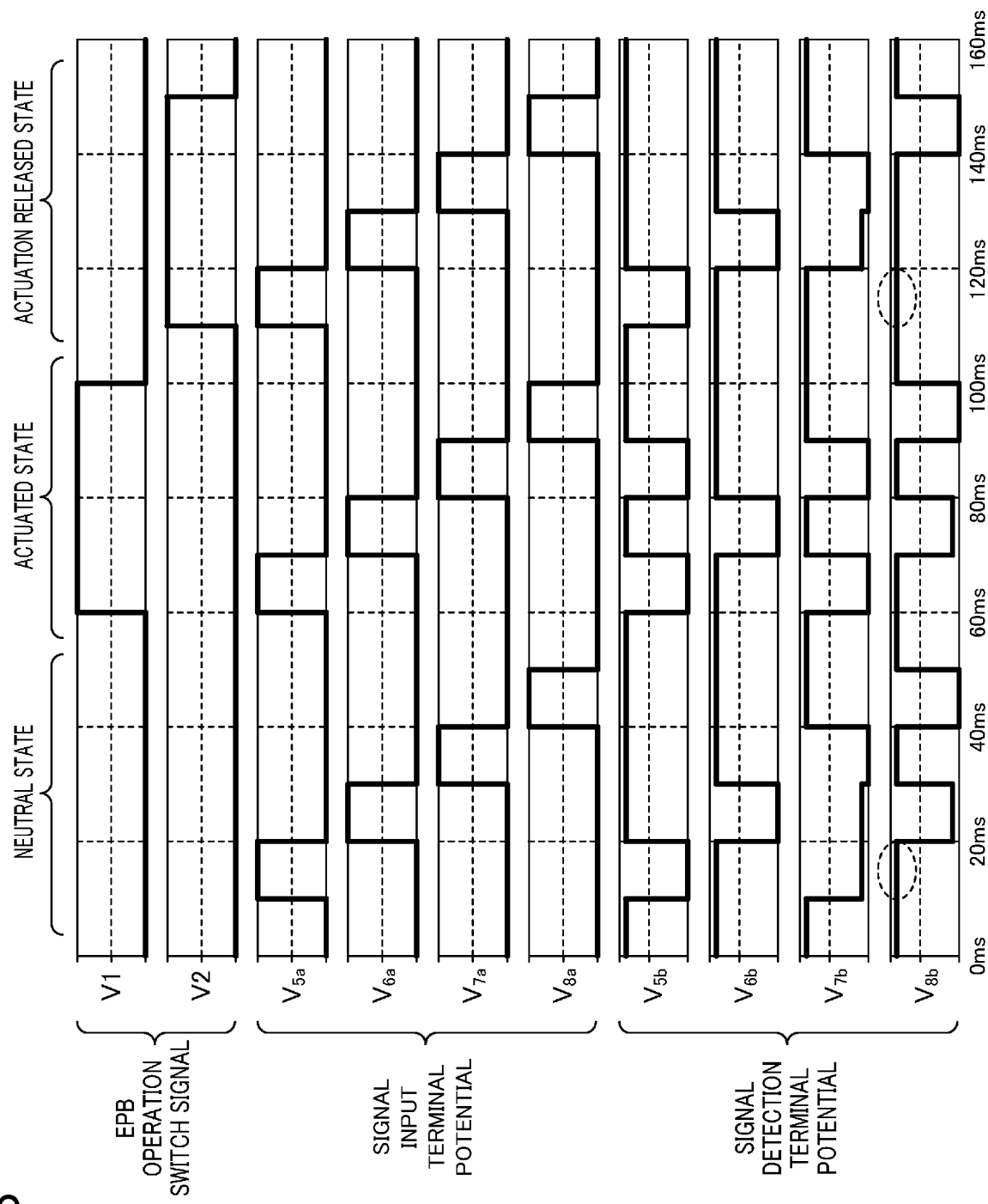
FIG. 18 is a time chart illustrating changes in potentials at the signal input terminals of the ECU and potentials at the signal detection terminals of the ECT over time in the fifth failure mode.

In such a case, abnormal conditions are more obvious in potential changes at the signal detection terminal 8*b* in the neutral state and in the actuation-released state of the switching circuit 100, as indicated in areas surrounded by dotted circles in FIG. 18, when compared with potential changes during normal operation (see FIG. 8).

In the neutral state or the actuation-released state, the potential at the signal detection terminal 8*b* is supposed to be the potential B when the potential at the signal input terminal 5*a* is set to Low, because a current is intended to flow from the SW terminal 4 toward the SW terminal 1.

In reality, however, a current does not flow between the SW terminal 4 and the SW terminal 1 because the diode 31 is non-conductive, and the potential at the signal detection terminal 8*b* is the potential C.

By comparing these potential changes with the potential changes during normal operation (see FIG. 8), the occurrence of a failure can be detected, and the failure mode can be identified.

As depicted in FIG. 8 and FIG. 18, in all of the cases in which the switching circuit 100 is in the neutral state, the actuated state, and the actuation-released state, the potential changes at the signal detection terminals 5*b* to 7*b* corresponding to the potential changes at the signal input terminals 5*a* to 7*a* are the same as those during normal operation.

Thus, if a diode open fault can be detected, the operating state of the EPB 500 can be estimated.

Note that potential changes are the same as those shown in the FIG. 18 when the switch 21 is stuck in the open state. Additional physical analysis is therefore necessary to detect a specific fault location.

(Sixth Failure Mode—Diode Short-Circuit Fault-)

The diode short-circuit fault refers to a failure in which a diode in the switching circuit 100 has lost its rectification characteristics and become conductive.

A case in which a failure occurs in the diode 31 as depicted in FIG. 17, specifically a case in which the diode 31 is short-circuited, will be described.

Figure 19:
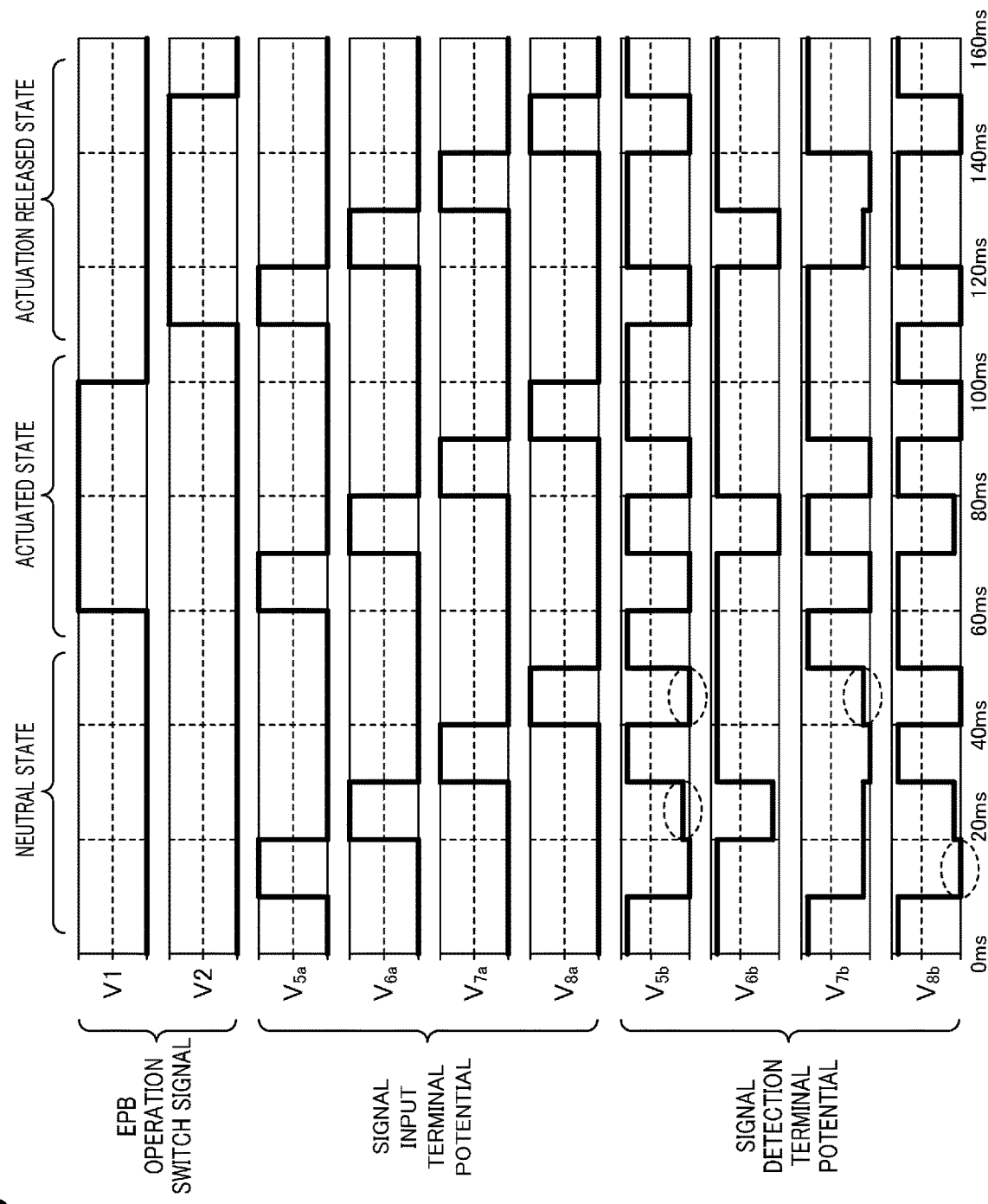
FIG. 19 is a time chart illustrating changes in potentials at the signal input terminals of the ECU and potentials at the signal detection terminals of the ECT over time in the sixth failure mode.

In such a case, abnormal conditions are more obvious in potential changes at signal detection terminals in the neutral state state of the switching circuit 100, as indicated in areas surrounded by dotted circles in FIG. 19, when compared with potential changes during normal operation (see FIG. 8).

A case in which the switching circuit 100 is in the neutral state will be described as an example.

When the diode 31 does not have a short-circuit fault and the potential at the signal input terminal 5a is set to Low, a current flows from the SW terminal 4 toward the SW terminal 1. Thus, the potential at the signal detection terminal 8b is a value close to the potential B.

Subsequently, when the potential at the signal input terminal 6a is set to Low, a current flows from the SW terminal 4 toward the SW terminal 2, and thus the potential at the signal detection terminal 8b is the potential B.

Here, if the diode 31 does not have a short-circuit fault, a current does not flow from the SW terminal 4 toward the SW terminal 1. Thus, the potential at the signal detection terminal 5b is supposed to be the potential C.

In reality, however, the potentials at the SW terminal 1 and the SW terminal 4 are substantially the same with each other because the diode 31 is short-circuited, which means that the potential at the signal detection terminal 5b is lowered to the potential B.

The potential at the signal detection terminal 5b is supposed to be the potential C when the potential at the signal input terminal 8a is set to Low, because a current is not intended to flow from the SW terminal 4 toward the SW terminal 1 due to the rectifying action of the diode 31.

In reality, however, a current flows from the SW terminal 1 toward the SW terminal 4 because the diode 31 is short-circuited, and the potential at the signal detection terminal 5b is therefore the potential A.

Accordingly, the potential at the SW terminal 1 decreases to below the potential at the SW terminal 3, which causes a current to flow from the SW terminal 3 toward the SW terminal 1, resulting in that the potential at the signal detection terminal 7b is the potential B.

By comparing these potential changes with the potential changes during normal operation (see FIG. 8), the occurrence of a failure can be detected, and the failure mode can be identified.

If potential change patterns at the time of a diode short-circuit fault are known, the operating state of the EPB 500 can be estimated by comparing the potential change patterns with those during normal operation.

(Seventh Failure Mode—Short Circuit Between Terminals—)

Figure 20:
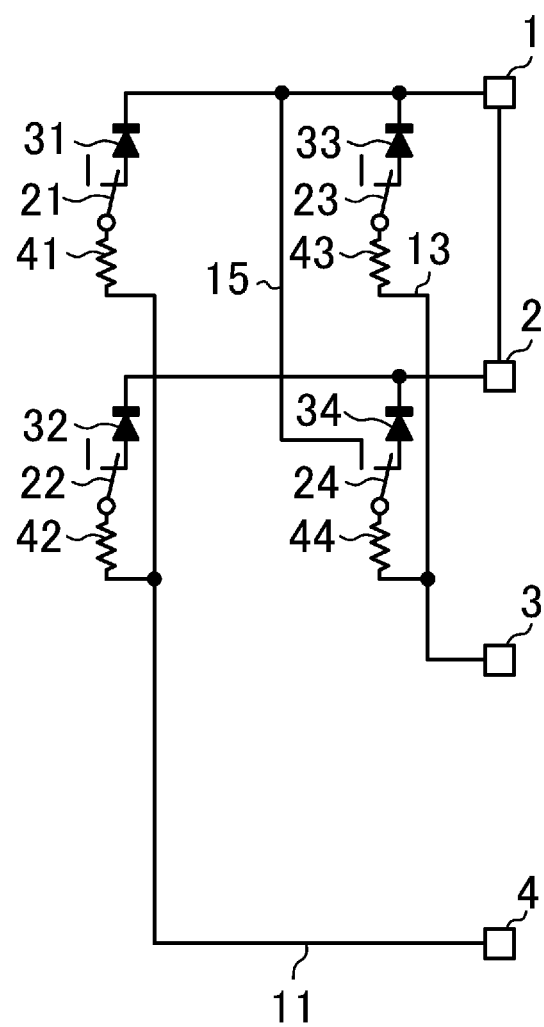
FIG. 20 is a diagram indicating a fault location of a seventh failure mode.

A case in which the SW terminal 1 and the SW terminal 2 are short-circuited as depicted in FIG. 20, will be described.

Figure 21:
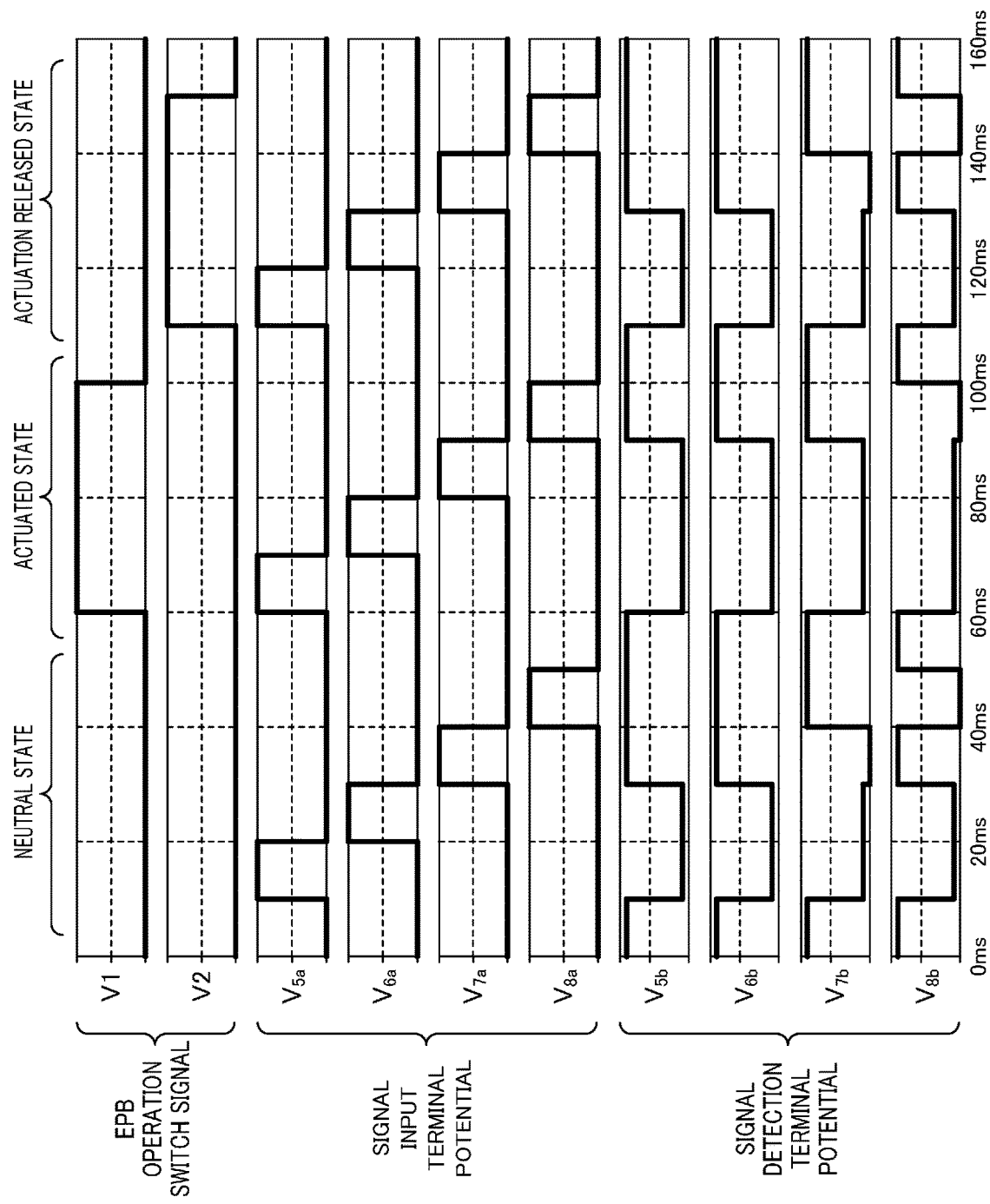
FIG. 21 is a time chart illustrating changes in potentials at the signal input terminals of the ECU and potentials at the signal detection terminals of the ECT over time in the seventh failure mode.

As depicted in FIG. 21, the potentials at the signal detection terminals 5b and 6b exhibit the same potential changes.

In the neutral state, when the potential at the signal input terminal 5a or 6a is set to Low, the potentials at both of the signal detection terminals 5b and 6b are the potential A.

In both cases, the potentials at the SW terminals 1 and 2 are lower than those at the SW terminals 3 and 4, and a current flows from the higher potential terminals to the terminals the lower potential potentials. Consequently, the potentials at the signal detection terminals 7b and 8b are the potential B.

In the actuated state, too, the potentials at both of the signal detection terminals 5b and 6b are the potential A, and the potentials at the signal detection terminals 7b and 8b are the potential B, when the potential at the signal input terminal 5a or 6a is set to Low.

When the potential at the signal input terminal 7a is set to Low, the potential at the signal detection terminal 5b is lowered such that the potentials are balanced, because the SW terminal 1 and the SW terminal 3 are connected to each other by the line 15. Accordingly, the potential at the signal detection terminal 6b is also lowered, and the potential at the SW terminal 2 is lower than the potential at the SW terminal 4. Consequently, a current flows from the SW terminal 4 toward the SW terminal 2, and the potential at the signal detection terminal 8b is also lowered to the potential B.

The potential change pattern in the actuation-released state is different from the potential pattern in the normal operation, due to a short circuit between the terminals. However, the description thereof is omitted.

By comparing these potential changes with the potential changes during normal operation (see FIG. 8), the occurrence of a failure can be detected, and the failure mode can be identified.

If potential change patterns at the time of an interterminal short-circuit fault are known, the operating state of the EPB 500 can be estimated by comparing the potential change patterns with those during normal operation.

In the above-described cases, if the switching circuit 100 is not provided with the line 15 as depicted in FIG. 2 to FIG. 4, that is, if the switching circuit 100 is not capable of compulsory activation of the ECU 300, the interterminal short-circuit fault can be detected, but the operating state of the EPB 500 cannot be estimated because the potential change patterns are all the same among the neutral state, the actuated state, and the actuation-released state.

(Eighth Failure Mode—Uncoupled Connector—)

Figure 22:
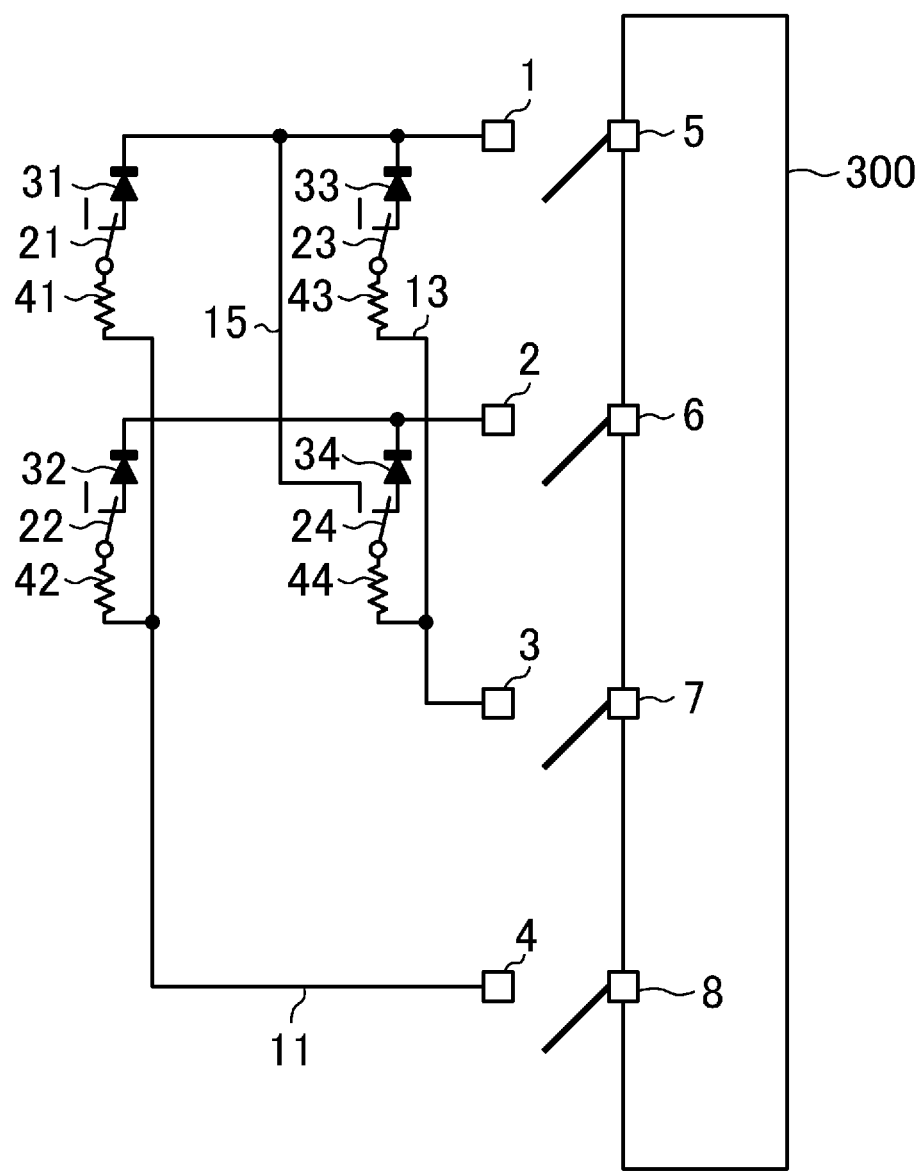
FIG. 22 is a diagram indicating a fault location of an eighth failure mode.

When connection is not established, such as when a connector is disconnected, between the switching circuit 100 and the ECU 300 as depicted in FIG. 22, a signal cannot be transmitted to the switching circuit 100 from the ECU 300.

Figure 23:
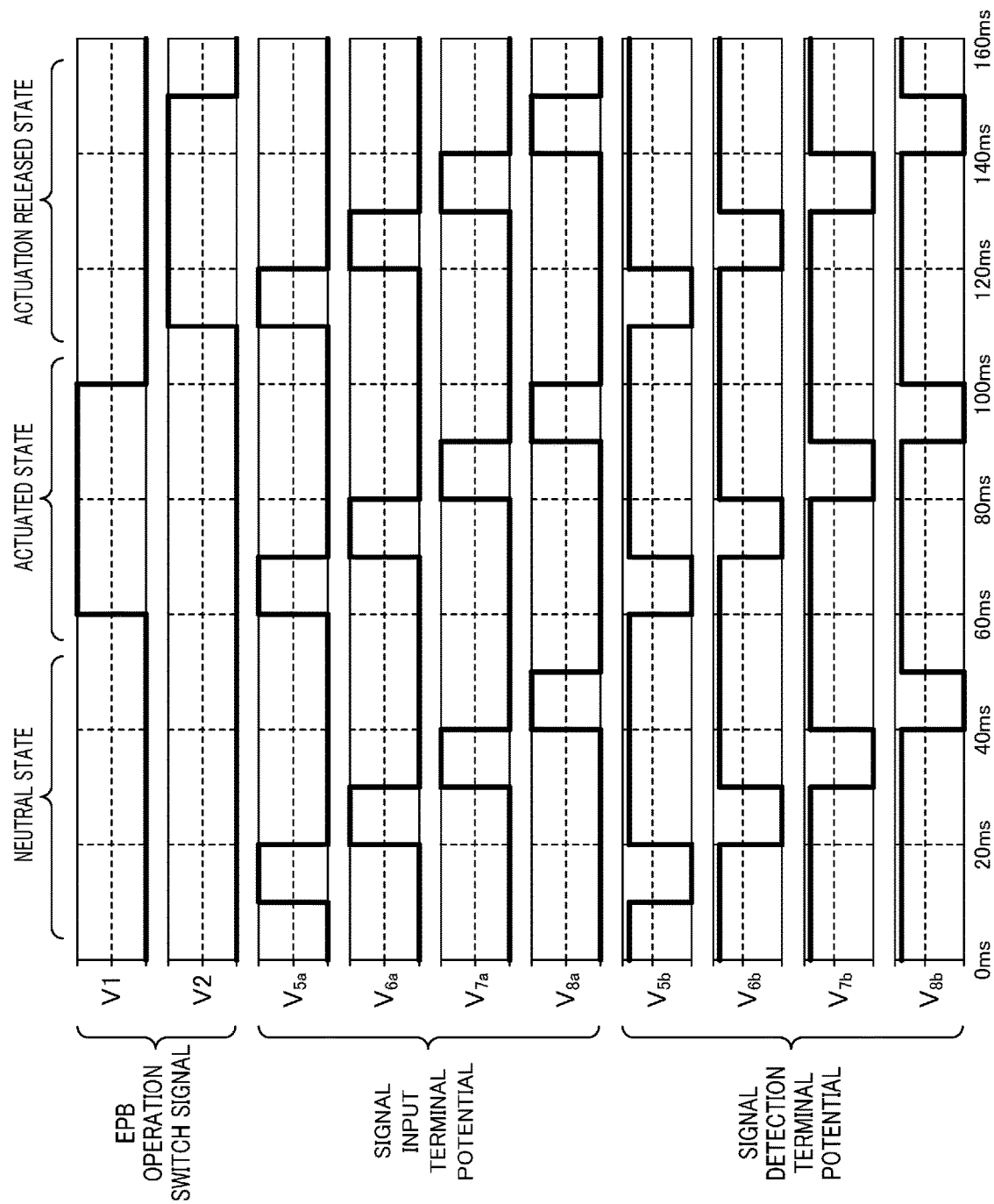
FIG. 23 is a time chart illustrating changes in potentials at the signal input terminals of the ECU and potentials at the signal detection terminals of the ECT over time in the eighth failure mode.

Thus, as depicted in FIG. 23, if the potentials at the signal input terminals 5a to 8a of the ECU 300 sequentially change, the potentials at the signal detection terminals 5b to 8b also change in accordance with the sequential changes in the potential at the signal input terminals 5a to 8a.

Thus, the connector disconnecting failure itself can be detected, but the operating state of the EPB 500 cannot be estimated because the potential change patterns are all the same among the neutral state, the actuated state, and the actuation-released state.

(Electrical Failure Notification by Illuminating Warning Lamp)

A failure detection method for a switching circuit according to the present invention uses the above-described control apparatus. The failure detection method includes at least: a first step of selecting one of the signal input terminals so as to make a potential of the one signal input terminal differ from potentials of the other three signal input terminals; a second step of making a potential of another signal input terminal, which is different from the one signal input terminal, differ from the potentials of the other three signal input terminals at regular time intervals; and a third step of detecting a failure that occurs in the switching circuit by measuring the potentials of the respective signal detection terminals in the first step and the second step.

By this method, the potential change of a detected signal with respect to an input signal is read, and thus the presence or absence of a failure in the switching circuit and its failure mode can be easily detected.

Vehicles are required by lows and regulations to notify the driver and the outside the vehicle of an electrical failure of a brake component of the vehicle, in the event of such a failure, by illuminating a warning lamp.

The electrical failure includes failures that occur in the first to eighth failure modes described above.

The failure mode of the switching circuit can be identified in the present embodiment. The failure can thus be easily notified to the outside the vehicle by illuminating the warning lamp.

Figure 24:
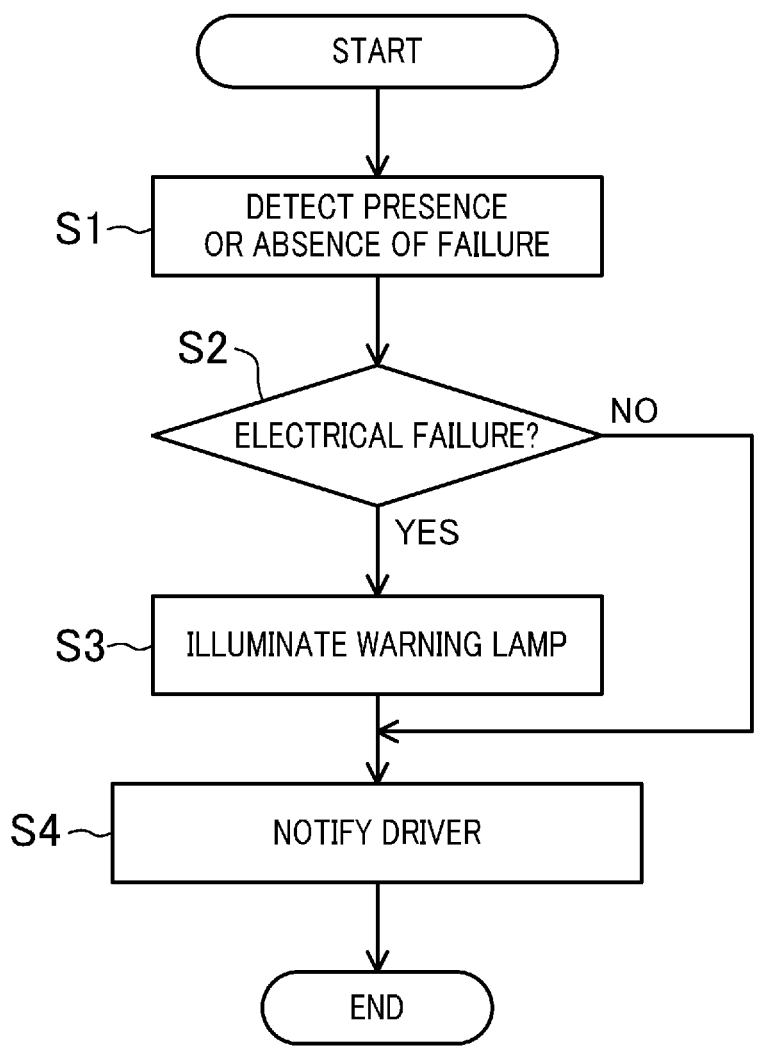
FIG. 24 is a flowchart of notification when an electrical failure is detected according to the third embodiment.

FIG. 24 is a flowchart of notification when an electrical failure is detected in the present embodiment.

For example, in the neutral state, the potentials at the signal detection terminals of the ECU 300 are sequentially changed to detect the presence of a failure (step S1). If a failure is detected, it is determined whether the failure is an electrical failure or not (step S2). Regardless of whether it is an electrical failure or not, the driver is notified that the failure has occurred (step S4). Notification may be made through letters or an image displayed on a multi-purpose display, a head-up display, or the like provided on an instrumental panel, may be made by voice, or may be made by a combination of the display and voice.

If the detected failure is an electrical failure, a signal is transmitted from the ECU 300 to a warning lamp controller 600 to illuminate a warning lamp 700 (step S3). Simultaneously or almost simultaneously with this illumination, the driver is notified that the failure has occurred (step S4).

As described in the foregoing, according to the present embodiment, signals are transmitted sequentially from the ECU 300 to the four SW terminals of the switching circuit 100 to measure the response patterns, thereby making it possible to detect the presence or absence of a failure in the switching circuit 100 or in the connecting portion between the switching circuit 100 and the ECU 300.

Furthermore, comparison of the potential change patterns in the ECU 300 with those in the normal operation makes it possible to detect the operating state of the EPB 500 and identify a failure mode and a fault location.

Thus, even in the event of a failure in the switching circuit 100, incorrect operation of the EPB 500 can be substantially prevented.

While the ECU 300 is in the normal state, signals output from the ECU 300 are continuously output to the switching circuit 100 and signals in response thereto are detected by the ECU 300, regardless of the operating state of the EPB 500.

INDUSTRIAL APPLICABILITY

The switching circuit of the present invention enables the operation of an EPB and failure detection for the EPB with a simple configuration, and is useful as switches for controlling the EPB.

DESCRIPTION OF REFERENCE CHARACTERS 1 to 4 SW Terminal
5 to 8 ECU Terminal
5a to 8a Signal Input Terminal
5b to 8b Signal Detection Terminal
9 Wake-Up Port (Activation Terminal)
11 to 15 Line
21 to 24 Switch
21a to 24a Common Terminal
21b to 24b Normally Closed Terminal
21c to 24c Normally Open Terminal
31 to 34 Diode
55 to 58 NPN Transistor
100 Switching Circuit
101 Input/Output Terminal Section
200 EPB Operation Switch
300 ECU (Electronic Control Unit)
400 EPB Controller
500 EPB (Electric Parking Brake)
600 Warning Lamp Controller
700 Warning Lamp

The invention claimed is:

1. A switching circuit configured to control actuation of an electric parking brake of a vehicle, the switching circuit comprising at least:
   an input/output terminal section including first to fourth terminals;
   a first line electrically connecting between the first terminal and the fourth terminal;
   a second line branching off from the first line and electrically connecting between the fourth terminal and the second terminal;
   a third line electrically connecting the first terminal and the third terminal;
   a fourth line branching off from the third line and electrically connecting between the third terminal and the second terminal;
   a first switch and a first diode that are disposed in a path of the first line;
   a second switch and a second diode that are disposed in a path of the second line;
   a third switch and a third diode that are disposed in a path of the third line; and
   a fourth switch and a fourth diode that are disposed in a path of the fourth line,
   wherein
   all of the four first to fourth switches are single-pole switches, or three of the first to fourth switches are single-pole switches and one of the first to fourth switches is a three-way switch, and
   the first diode is provided to a normally closed terminal of the first switch,
   the second diode is provided to a normally closed terminal of the second switch,
   the third diode is provided to a normally closed terminal of the third switch, and
   the fourth diode is provided to a normally closed terminal of the fourth switch.

2. The switching circuit of claim 1, wherein the first to fourth diodes are disposed such that all of the four diodes are oriented in the same direction.

3. The switching circuit of claim 1, wherein the first switch and the fourth switch constitute one switch group, and the second switch and the third switch constitute another switch group,
   when an actuation state of the electric parking brake changes, the switches in the one switch group are opened and closed in synchronization with each other, and the switches in the other switch group are opened and closed in synchronization with each other, and
   when the electric parking brake is actuated and when actuation of the electric parking brake is released, open/closed states of the switches in the one switch group and open/closed states of the switches in the other switch group are selected so as to be different between the groups.

4. The switching circuit of claim 3, wherein
when the electric parking brake is actuated, a common terminal of each switch in the one switch group is connected to a normally open terminal of the switch, and a common terminal of each switch in the other switch group is connected to the normally closed terminal of the switch, and
when actuation of the electric parking brake is released, the common terminal of each switch in the one switch group is connected to the normally closed terminal of the switch, and the common terminal of each switch in the other switch group is connected to a normally open terminal of the switch.

5. The switching circuit of claim 1, wherein
the fourth switch is the three-way switch, and
the switching circuit further includes a fifth line electrically connecting between the normally open terminal of the fourth switch and the first line connected toward the normally closed terminal of the first switch.

6. A control apparatus comprising:
a switching circuit configured to control actuation of an electric parking brake of a vehicle; and
an electronic control unit electrically connected to the switching circuit and configured to control an electrical system of a vehicle are electrically connected, wherein
the switching circuit includes at least:
an input/output terminal section including first to fourth terminals;
a first line electrically connecting between the first terminal and the fourth terminal;
a second line branching off from the first line and electrically connecting between the fourth terminal and the second terminal;
a third line electrically connecting the first terminal and the third terminal;
a fourth line branching off from the third line and electrically connecting between the third terminal and the second terminal;
a first switch and a first diode that are disposed in a path of the first line;
a second switch and a second diode that are disposed in a path of the second line;
a third switch and a third diode that are disposed in a path of the third line; and
a fourth switch and a fourth diode that are disposed in a path of the fourth line,
all of the four first to fourth switches are single-pole switches, or three of the first to fourth switches are single-pole switches and one of the first to fourth switches is a three-way switch,
the first diode is provided to a normally closed terminal of the first switch,
the second diode is provided to a normally closed terminal of the second switch,
the third diode is provided to a normally closed terminal of the third switch,
the fourth diode is provided to a normally closed terminal of the fourth switch,
the electronic control unit includes a fifth terminal to be electrically connected to the first terminal, a sixth terminal to be electrically connected to the second terminal, a seventh terminal to be electrically connected to the third terminal, and an eighth terminal to be electrically connected to the fourth terminal,
the fifth terminal, the sixth terminal, the seventh terminal, and the eighth terminal each have a signal input terminal and a signal detection terminal, and
a signal input from one of the signal input terminals to an associated terminal of the input/output terminal section passes through a conducting path in the switching circuit, and is detected by an associated one of the signal detection terminals.

7. A control apparatus comprising:
a switching circuit of claim 5 configured to control actuation of an electric parking brake of a vehicle; and
an electronic control unit configured to control an electrical system of a vehicle are electrically connected, wherein
the switching circuit includes at least:
an input/output terminal section including first to fourth terminals;
a first line electrically connecting between the first terminal and the fourth terminal;
a second line branching off from the first line and electrically connecting between the fourth terminal and the second terminal;
a third line electrically connecting the first terminal and the third terminal;
a fourth line branching off from the third line and electrically connecting between the third terminal and the second terminal;
a first switch and a first diode that are disposed in a path of the first line;
a second switch and a second diode that are disposed in a path of the second line;
a third switch and a third diode that are disposed in a path of the third line; and
a fourth switch and a fourth diode that are disposed in a path of the fourth line,
all of the first to third switches are single-pole switches, or two of the first to third switches are single-pole switches and one of the first to third switches is a three-way switch,
the fourth switch is a three-way switch,
the first diode is provided to a normally closed terminal of the first switch,
the second diode is provided to a normally closed terminal of the second switch,
the third diode is provided to a normally closed terminal of the third switch,
the fourth diode is provided to a normally closed terminal of the fourth switch,
the switching circuit further includes a fifth line electrically connecting between a normally open terminal of the fourth switch and the first line connected toward the normally closed terminal of the first switch,
the electronic control unit includes a fifth terminal to be electrically connected to the first terminal, a sixth terminal to be electrically connected to the second terminal, a seventh terminal to be electrically connected to the third terminal, and an eighth terminal to be electrically connected to the fourth terminal,
the fifth terminal, the sixth terminal, the seventh terminal, and the eighth terminal each have a signal input terminal and a signal detection terminal,
a signal input from one of the signal input terminals to an associated terminal of the input/output terminal section passes through a conducting path in the switching circuit, and is detected by an associated one of the signal detection terminals, and by connecting a common terminal of the fourth switch to a normally open terminal of the fourth switch, a current for activating the electronic control unit is supplied to an activation terminal of the electronic control unit from the fifth terminal through the fourth switch and the third terminal.

8. The switching circuit of claim 1, wherein the first to fourth diodes are disposed such that all of the four diodes are oriented in the same direction, and when the electric parking brake is actuated and when actuation of the electric parking brake is released, open/closed states of the switches in one switch group and open/closed states of the switches in another switch group are selected so as to be different between the groups.

9. The switching circuit of claim 8, wherein when the electric parking brake is actuated, a common terminal of each switch in the one switch group is connected to a normally open terminal of the switch, and a common terminal of each switch in the other switch group is connected to the normally closed terminal of the switch, and when actuation of the electric parking brake is released, the common terminal of each switch in the one switch group is connected to the normally closed terminal of the switch, and the common terminal of each switch in the other switch group is connected to a normally open terminal of the switch.

10. The switching circuit of claim 2, wherein the fourth switch is the three-way switch, and the switching circuit further includes a fifth line electrically connecting between the normally open terminal of the fourth switch and the first line connected toward the normally closed terminal of the first switch.

11. The switching circuit of claim 3, wherein the fourth switch is the three-way switch, and the switching circuit further includes a fifth line electrically connecting between the normally open terminal of the fourth switch and the first line connected toward the normally closed terminal of the first switch.

12. The switching circuit of claim 5, wherein the fourth switch is the three-way switch, and the switching circuit further includes a fifth line electrically connecting between the normally open terminal of the fourth switch and the first line connected toward the normally closed terminal of the first switch.

13. The switching circuit of claim 8, wherein the fourth switch is the three-way switch, and the switching circuit further includes a fifth line electrically connecting between the normally open terminal of the fourth switch and the first line connected toward the normally closed terminal of the first switch.

14. The switching circuit of claim 9, wherein the switching circuit further includes a fifth line electrically connecting between the normally open terminal of the fourth switch and the first line connected toward the normally closed terminal of the first switch.

* * * * *